(12) United States Patent
Liao et al.

(10) Patent No.: US 8,034,465 B2
(45) Date of Patent: Oct. 11, 2011

(54) PHOSPHORESCENT OLED HAVING DOUBLE EXCITON-BLOCKING LAYERS

(75) Inventors: Liang-Sheng Liao, Rochester, NY (US);
Xiaofan Ren, Rochester, NY (US);
Cynthia A. Pellow, Fairport, NY (US);
Yuan-Sheng Tyan, Webster, NY (US)

(73) Assignee: Global OLED Technology LLC, Wilmington, DE (US)

( * ) Notice: Subject to any disclaimer, the term of this patent is extended or adjusted under 35 U.S.C. 154(b) by 821 days.

(21) Appl. No.: 11/765,598

(22) Filed: Jun. 20, 2007

(65) Prior Publication Data
US 2008/0315753 A1 Dec. 25, 2008

(51) Int. Cl.
*H01L 51/54* (2006.01)
(52) U.S. Cl. ........ 428/690; 428/917; 313/504; 313/506; 252/301.16; 257/40; 257/89
(58) Field of Classification Search .................. None
See application file for complete search history.

(56) References Cited

U.S. PATENT DOCUMENTS

| | | |
|---|---|---|
| 3,172,862 A | 3/1965 | Gurnee et al. |
| 3,173,050 A | 3/1965 | Gurnee |
| 3,180,730 A | 4/1965 | Klupfel et al. |
| 3,567,450 A | 3/1971 | Brantly et al. |
| 3,658,520 A | 4/1972 | Brantly et al. |
| 3,710,167 A | 1/1973 | Dresner et al. |
| 4,356,429 A | 10/1982 | Tang |
| 4,720,432 A | 1/1988 | Vanslyke et al. |
| 4,885,211 A | 12/1989 | Tang et al. |
| 4,885,221 A | 12/1989 | Tsuneeda et al. |
| 5,059,861 A | 10/1991 | Littman et al. |
| 5,059,862 A | 10/1991 | Vanslyke et al. |
| 5,061,569 A | 10/1991 | Vanslyke et al. |
| 5,247,190 A | 9/1993 | Friend et al. |

(Continued)

FOREIGN PATENT DOCUMENTS

EP 0 732 868 9/1996

(Continued)

OTHER PUBLICATIONS

Johnson et al., "Luminescent Iridium(l), Rhodium(l), and Platinum(ll) Dithiolate Complexes", Journal of American Chemical Society, vol. 105, pp. 1795-1802, 1983.

(Continued)

*Primary Examiner* — Callie Shosho
*Assistant Examiner* — Michael H Wilson
(74) *Attorney, Agent, or Firm* — McKenna Long & Aldridge LLP

(57) ABSTRACT

An organic light-emitting device comprising an anode; a cathode; a hole-transporting layer disposed between the anode and the cathode; a phosphorescent light-emitting layer disposed between the hole-transporting layer and the cathode, wherein the phosphorescent light-emitting layer includes at least one host and at least one phosphorescent dopant; a first exciton-blocking layer disposed between the hole-transporting layer and the phosphorescent light-emitting layer; wherein the first exciton-blocking layer has a triplet energy greater than the triplet energy of the host in the phosphorescent light-emitting layer; and a second exciton-blocking layer disposed between the first exciton-blocking layer and the phosphorescent light-emitting layer, wherein the second exciton-blocking layer is in contact with the phosphorescent light-emitting layer, and wherein the second exciton-blocking layer has a triplet energy less than the triplet energy of the first exciton-blocking layer.

19 Claims, 7 Drawing Sheets

U.S. PATENT DOCUMENTS

| | | |
|---|---|---|
| 5,276,380 A | 1/1994 | Tang |
| 5,283,182 A | 2/1994 | Powell et al. |
| 5,294,870 A | 3/1994 | Tang et al. |
| 5,405,709 A | 4/1995 | Littman et al. |
| 5,503,910 A | 4/1996 | Matsuura et al. |
| 5,608,287 A | 3/1997 | Hung et al. |
| 5,645,948 A | 7/1997 | Shi et al. |
| 5,677,572 A | 10/1997 | Hung et al. |
| 5,683,823 A | 11/1997 | Shi et al. |
| 5,688,551 A | 11/1997 | Littman et al. |
| 5,703,436 A | 12/1997 | Forrest et al. |
| 5,714,838 A | 2/1998 | Haight et al. |
| 5,739,545 A | 4/1998 | Guha et al. |
| 5,766,779 A | 6/1998 | Shi et al. |
| 5,776,622 A | 7/1998 | Hung et al. |
| 5,776,623 A | 7/1998 | Hung et al. |
| 5,837,391 A | 11/1998 | Utsugi |
| 5,851,709 A | 12/1998 | Grande et al. |
| 5,969,474 A | 10/1999 | Arai |
| 5,981,306 A | 11/1999 | Burrows et al. |
| 6,066,357 A | 5/2000 | Tang et al. |
| 6,097,147 A | 8/2000 | Baldo et al. |
| 6,137,223 A | 10/2000 | Hung et al. |
| 6,140,763 A | 10/2000 | Hung et al. |
| 6,172,459 B1 | 1/2001 | Hung et al. |
| 6,226,890 B1 | 5/2001 | Boroson et al. |
| 6,237,529 B1 | 5/2001 | Spahn et al. |
| 6,278,236 B1 | 8/2001 | Madathil et al. |
| 6,284,393 B1 | 9/2001 | Hosokawa et al. |
| 6,303,238 B1 | 10/2001 | Thompson et al. |
| 6,337,492 B1 * | 1/2002 | Jones et al. ............ 257/40 |
| 6,413,656 B1 | 7/2002 | Thompson et al. |
| 6,423,429 B2 | 7/2002 | Kido et al. |
| 6,670,645 B2 | 12/2003 | Grushin et al. |
| 6,677,060 B2 | 1/2004 | Li et al. |
| 6,687,266 B1 | 2/2004 | Ma et al. |
| 6,720,573 B2 | 4/2004 | Son et al. |
| 6,733,905 B2 | 5/2004 | Takiguchi et al. |
| 6,780,528 B2 | 8/2004 | Tsuboyama et al. |
| 6,824,895 B1 | 11/2004 | Sowinski et al. |
| 6,951,694 B2 | 10/2005 | Thompson et al. |
| 2002/0025419 A1 | 2/2002 | Lee et al. |
| 2002/0100906 A1 | 8/2002 | Takiguchi et al. |
| 2002/0121638 A1 | 9/2002 | Grushin et al. |
| 2002/0134984 A1 | 9/2002 | Igarashi |
| 2002/0182441 A1 | 12/2002 | Lamansky et al. |
| 2003/0010877 A1 | 1/2003 | Landreville et al. |
| 2003/0017361 A1 | 1/2003 | Thompson et al. |
| 2003/0040627 A1 | 2/2003 | Fujii |
| 2003/0054198 A1 | 3/2003 | Tsuboyama et al. |
| 2003/0059646 A1 | 3/2003 | Kamatani et al. |
| 2003/0068526 A1 | 4/2003 | Kamatani et al. |
| 2003/0068535 A1 | 4/2003 | Takiguchi et al. |
| 2003/0072964 A1 | 4/2003 | Kwong et al. |
| 2003/0096138 A1 | 5/2003 | Lecloux et al. |
| 2003/0173896 A1 | 9/2003 | Grushin et al. |
| 2003/0235712 A1 | 12/2003 | Takiguchi et al. |
| 2004/0013905 A1 | 1/2004 | Tsuboyama et al. |
| 2004/0068132 A1 | 4/2004 | Lecloux et al. |
| 2004/0072018 A1 | 4/2004 | Herron et al. |
| 2004/0086743 A1 | 5/2004 | Brown et al. |
| 2004/0113547 A1 | 6/2004 | Son et al. |
| 2004/0121184 A1 | 6/2004 | Thompson et al. |
| 2006/0134460 A1 | 6/2006 | Kondakova et al. |
| 2006/0175957 A1 | 8/2006 | Suzuri et al. |
| 2007/0111026 A1 | 5/2007 | Deaton et al. |

FOREIGN PATENT DOCUMENTS

| | | |
|---|---|---|
| EP | 0 891 121 | 1/1999 |
| EP | 1 029 909 | 8/2000 |
| EP | 1 076 368 | 2/2001 |
| EP | 1 182 244 | 2/2002 |
| EP | 1 187 235 | 3/2002 |
| EP | 1 238 981 | 9/2002 |
| EP | 1 239 526 | 9/2002 |
| EP | 1 244 155 | 9/2002 |
| EP | 1 371 708 | 12/2003 |
| JP | 2003-059667 | 2/2003 |
| JP | 2003-073387 | 3/2003 |
| JP | 2003-073388 | 3/2003 |
| JP | 2003-073665 | 3/2003 |
| WO | WO 00/57676 | 9/2000 |
| WO | WO 00/70655 | 11/2000 |
| WO | WO 01/41512 | 6/2001 |
| WO | WO 03/040256 | 5/2003 |
| WO | WO 03/079737 | 9/2003 |
| WO | WO 03/091355 | 11/2003 |
| WO | WO 2004/015025 | 2/2004 |
| WO | WO 2004/020448 | 3/2004 |

OTHER PUBLICATIONS

Wrighton et al., The Nature of the Lowest Excited State in Tricarbonylchloro-1,10-phenanthrolinerhenium(I) and Related Complexes, Journal of the American Chemical Society, vol. 96, No. 4, pp. 998-1003, 1974.

Yam, "Luminescent carbon-rich rhenium(I) complexes", Chem. Commun. pp. 789-796, 2001.

Kido et al., "Electroluminescence in a Terbium Complex", Chem. Lett. pp. 657-660, 1990.

Kido et al., "Organic electroluminescent devices using lanthanide complexes", J. Alloys and Compounds 192, pp. 30-33, 1993.

Kido et al., White-Light-Emitting Organic Electroluminescent Device Using Lanthanide Complexes, Jpn. J. Appl. Phys., vol. 35, pp. L394-L396, 1996.

Kido et al., "Bright red light-emitting organic electroluminescent devices having a europium complex as an emitter", Appl. Phys. Lett., 65 (17), pp. 2124-2126, 1994.

Dressner: Double Injection Electroluminescence in Anthracene; RCA Laboratories; (1969); pp. 322-334.

Adachi et al.; Electroluminence in Organic Films with Three-Layer Structure; Japanese Journal of Applied Physics: vol. 27, No. 2, Feb. 1998, pp. L269-L271.

Tang et al.; Electroluminescence of Doped Organic Thin Films; Japanese Journal of Applied Physics, 65, (9): 3610-3616; May 1, 1989.

* cited by examiner

US 8,034,465 B2

PHOSPHORESCENT OLED HAVING DOUBLE EXCITON-BLOCKING LAYERS

CROSS REFERENCE TO RELATED APPLICATION

Reference is made to commonly assigned U.S. patent application Ser. No. 11/749,883, filed May 17, 2007, pending, entitled "Hybrid OLED With Fluorescent and Phosphorescent Layers" by Joesph Deaton et al.; commonly assigned U.S. patent application Ser. No. 11/749,899, filed May 17, 2007, pending, entitled "Hybrid Fluorescent/Phosphorescent OLEDs" by Joesph Deaton et al.; and U.S. patent application Ser. No. 11/749,875, filed May 17, 2007 pending, entitled "Hybrid OLED Having Improved Efficiency" by Liang-Sheng Liao et al., the disclosures of which are herein incorporated by reference.

FIELD OF THE INVENTION

The present invention relates to organic light-emitting devices (OLEDs) or organic electroluminescent (EL) devices comprising a phosphorescent light-emitting layer and two adjacent exciton-blocking layers.

BACKGROUND OF THE INVENTION

Organic light-emitting devices (OLEDs) or organic electroluminescent (EL) devices have been known for several decades, however, their performance limitations have represented a barrier for many applications. In the simplest form, an OLED is comprised of an anode for hole injection, a cathode for electron injection, and an organic medium sandwiched between these electrodes to support charge recombination and emission of light. Representative of earlier OLEDs can be found in the *RCA Review,* 30, 322 (1969), entitled "Double Injection Electroluminescence in Anthracene" and U.S. Pat. Nos. 3,172,862; 3,173,050; and 3,710,167. The organic layers in these devices, usually composed of a polycyclic aromatic hydrocarbon, were very thick (much greater than 1 μm). Consequently, operating voltages were very high, often >100V.

More recent OLEDs include an organic EL medium containing extremely thin layers (e.g. <1.0 μm) between the anode and the cathode. Herein, the term "organic EL medium" encompasses the layers between the anode and cathode. Reducing the thickness has lowered the resistance of the organic layers and enabled devices that operate at much lower voltage. In a basic two-layer OLED structure, described first in U.S. Pat. No. 4,356,429 by Tang, one organic layer of the EL medium adjacent to the anode is specifically selected to transport holes, and therefore is referred to as the hole-transporting layer (HTL), and the other organic layer is specifically selected to transport electrons and is referred to as the electron-transporting layer (ETL). Recombination of the injected holes and electrons within the organic EL medium, results in efficient electroluminescence.

Based on the two-layer OLED structure, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics,* 27, L269 (1988), and by Tang et al., "Electroluminescence of Doped Organic Thin Films", *Journal of Applied Physics,* 65, 3610 (1989). The LEL commonly include a host material doped with a guest material, otherwise known as a dopant. Further, there are other multi-layer OLEDs that contain additional functional layers such as a hole-injecting layer (HIL), an electron-injecting layer (EIL), an electron-blocking layer (EBL), or a hole-blocking layer (HBL) in the devices. These new structures have resulted in improved device performance.

Many light-emitting materials emit light from their excited singlet state by fluorescence. The excited singlet state can be created when excitons formed in an OLED transfer their energy to the singlet excited state of the dopant. However, only 25% of the excitons created in an OLED are singlet excitons. The remaining excitons are triplets, which cannot readily transfer their energy to the dopant to produce the singlet excited state of a dopant. This results in a large loss in efficiency since 75% of the excitons are not used in the light emission process.

Triplet excitons can transfer their energy to a dopant if the dopant has a triplet excited state that is low enough in energy. If the triplet state of the dopant is emissive it can produce light by phosphorescence. In many cases, singlet excitons call also transfer their energy to the lowest singlet excited state of the same dopant. The singlet excited state can often relax, by an intersystem crossing process, to the emissive triplet excited state. By the proper choice of host and dopant, energy can be collected from both the singlet and triplet excitons created in an OLED. The term electrophosphorescence is sometimes used to denote EL wherein the mechanism of luminescence is phosphorescence; the term phosphorescent OLED is used to denote the OLED that can produce electrophosphorescence.

From device architecture perspective, in order to achieve improved quantum efficiency in a phosphorescent OLED, blocking layer, either hole-blocking layer or electron-blocking layer, has been used in confining carriers and excitons within a light-emitting layer. For example, Baldo et al in U.S. Pat. No. 6,097,147 teach to form a hole-blocking layer, such as bathocuprione (BCP), between a light-emitting layer and an electron-transporting layer in a phosphorescent OLED. Thompson et al. in U.S. Pat. No. 6,951,694 disclose phosphorescent OLEDs comprising an electron-blocking layer and a light-emitting layer with a neat host and a phosphorescent dopant. By inserting an electron-blocking layer between the hole-transporting layer and the light-emitting layer electron leakage can be eliminated and, hence, luminous efficiency is increased. Fac-tris (1-phenylpyrazolato, N,$C^{2'}$)Iridium(III) (Irppz) and Iridium(III)bis(1-phenylpyrazolato, N,$C^{2'}$)(2,2,6,6-tetramethyl-3,5-heptanedionato-O,O) ($ppz_2$Ir(dpm)) have been disclosed as suitable electron-blocking materials.

Recently, Kondakova et al in US 2006/134,460 A1 disclose phosphorescent OLEDs comprising an exciton-blocking layer and a co-host light-emitting layer having at least one hole-transporting host and at least one electron-transporting host, together with at least one phosphorescent dopant. The exciton-blocking layer in the devices includes a hole-transporting material with triplet energy greater or equal to 2.5 eV adjacent the light-emitting layer on the anode side.

Notwithstanding all these developments, there remains a need to further improve quantum efficiency and operational lifetime of the phosphorescent OLEDs.

SUMMARY OF THE INVENTION

Although an exciton-blocking layer between a hole-transporting layer and a phosphorescent light-emitting layer can effectively block excitons from diffusing into the hole-transporting layer and can increase quantum efficiency in a phosphorescent OLED, it has been found that only one exciton-blocking layer between the hole-transporting layer and the phosphorescent light-emitting layer cannot fully block the singlet exciton diffusion from the light-emitting layer into the hole-transporting layer. It also may not be fully block the triplet exciton diffusion from the light-emitting layer into the hole-transporting layer. As a result, the electrophosphorescence of the phosphorescent OLED can be partially quenched and the operational lifetime can be negatively affected.

It is therefore an object of the present invention to improve the quantum efficiency of a phosphorescent OLED.

It is another object of the present invention to improve the operational lifetime of a phosphorescent OLED.

These objects are achieved by an organic light-emitting device comprising:
  a) an anode;
  b) a cathode;
  c) a hole-transporting layer disposed between the anode and the cathode;
  d) a phosphorescent light-emitting layer disposed between the hole-transporting layer and the cathode, wherein the phosphorescent light-emitting layer includes at least one host and at least one phosphorescent dopant;
  e) a first exciton-blocking layer disposed between the hole-transporting layer and the phosphorescent light-emitting layer; wherein the first exciton-blocking layer has a triplet energy greater than the triplet energy of the host in the phosphorescent light-emitting layer; and
  f) a second exciton-blocking layer disposed between the first exciton-blocking layer and the phosphorescent light-emitting layer, wherein the second exciton-blocking layer is in contact with the phosphorescent light-emitting layer, and wherein the second exciton-blocking layer has a triplet energy less than the triplet energy of the first exciton-blocking layer.

The present invention inserts a second exciton-blocking layer between the first exciton-blocking layer and the light-emitting layer to further enhance the exciton-blocking effect. It is an advantage of the present invention that the phosphorescent OLED having the second exciton-blocking layer can produce electrophosphorescence with improved quantum efficiency and operational lifetime.

It will be understood that FIGS. 1-4 are not to scale since the individual layers are too thin and the thickness differences of various layers are too treat to permit depiction to scale.

DETAILED DESCRIPTION OF THE INVENTION

The present invention can be employed in many OLED configurations using small molecule materials, oligomeric materials, polymeric materials, or combinations thereof. These include from very simple structures having a single anode and cathode to more complex devices, such as passive matrix (displays having orthogonal arrays of anodes and cathodes to form pixels, and active-matrix displays where each pixel is controlled independently, for example, with thin film transistors (TFTs). There are numerous configurations of the organic layers, wherein, the present invention is successfully practiced.

Figure 1:
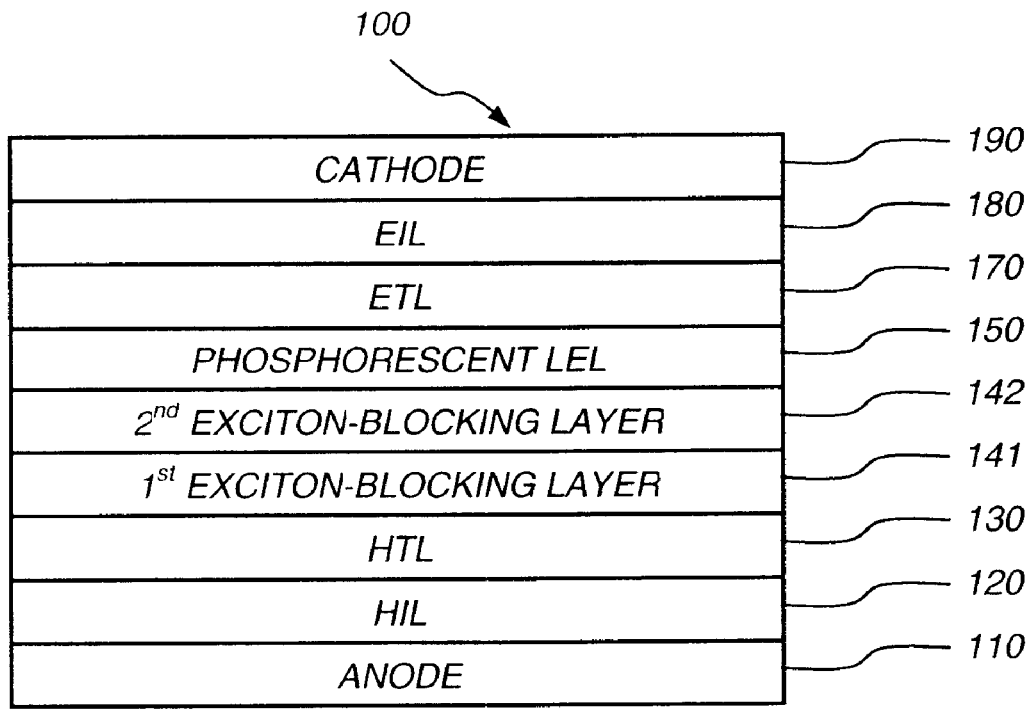
FIG. 1 shows a cross-sectional view of one embodiment of a phosphorescent OLED prepared in accordance with the present invention.
Figure 2:
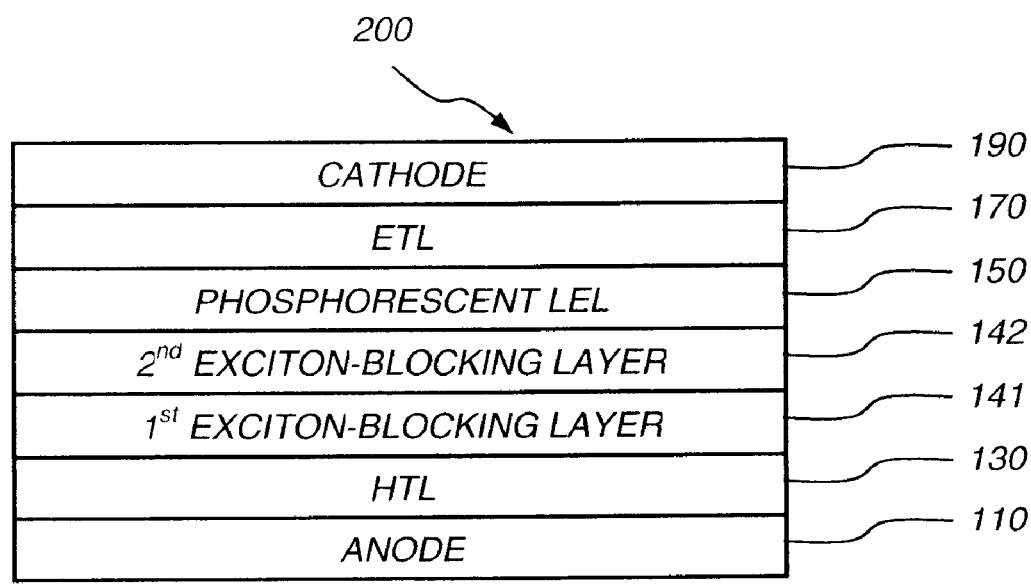
FIG. 2 shows a cross-sectional view of another embodiment of a phosphorescent OLED prepared in accordance with the present invention.

A typical structure according to the present invention and especially useful for a small molecule device is shown in FIG. 1. OLED 100 in FIG. 1 includes anode 110, HIL 120, HTL 130, first exciton-blocking layer 141, second exciton-blocking layer 142, phosphorescent LEL 150, ETL 170, EIL 180 and cathode 190. OLED 100 can be operated by applying an electric potential produced by a voltage/current source between the pair of the electrodes, anode 110 and cathode 190. Shown in FIG. 2 is OLED 200, which is another embodiment of OLEDs prepared in accordance with the present invention. OLED 200 in FIG. 2 is the same as OLED 100 except that there is no HIL 120 nor EIL 180 in OLED 200.

Figure 3:
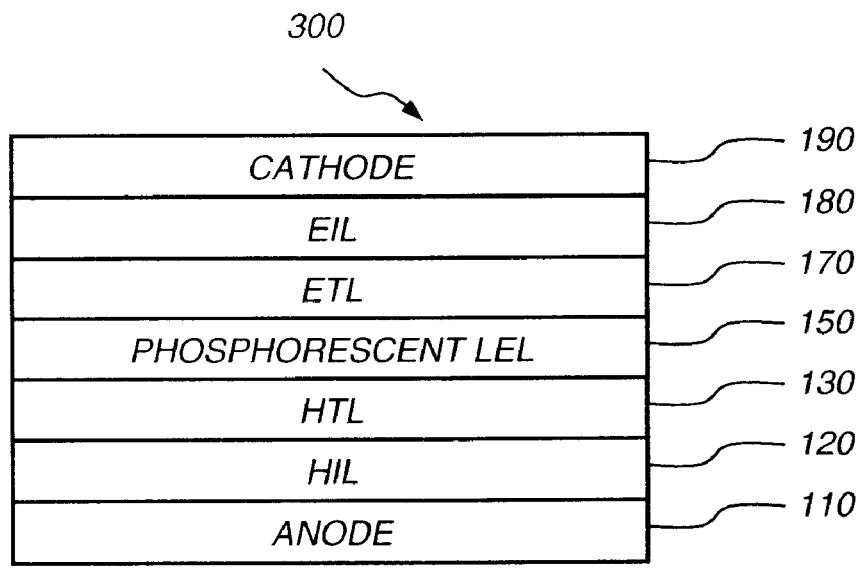
FIG. 3 shows a cross-sectional view of a prior art phosphorescent OLED.
Figure 4:
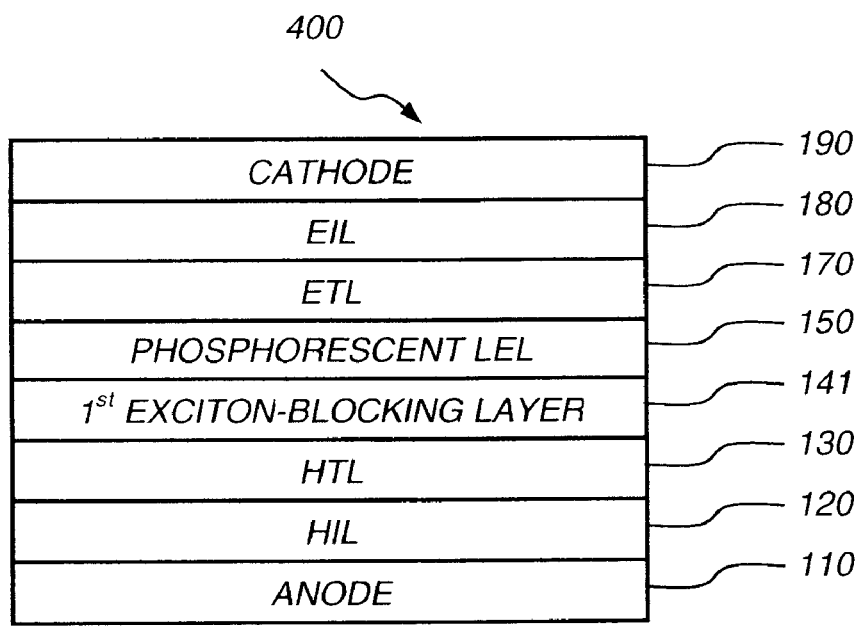
FIG. 4 shows a cross-sectional view of another prior art phosphorescent OLED.

As a comparison, shown in FIGS. 3 and 4 are OLED 300 and OLED 400, respectively, which are the OLEDs prepared in accordance with the prior art. OLED 300 in FIG. 3 includes anode 110, HIL 120, HTL 130, phosphorescent LEL 150, ETL 170, EIL 180 and cathode 190. OLED 400 in FIG. 4 is the same as OLED 300 except that there is exciton-blocking layer 440 disposed in between HTL 130 and phosphorescent LEL 150 in OLED 400. The difference between the prior art OLEDs and the OLEDs prepared in accordance with the present invention is that there is no second exciton-blocking layer in the prior art OLEDs.

In order to facilitate a detailed discussion on the aforementioned OLEDs, several terms are discussed as follows:

Triplet energy can be measured by any of several means, as discussed for instance in S. L. Murov, I. Carmichael, and G. L. Hug, *Handbook of Photochemistry*, 2nd ed. (Marcel Dekker, New York, 1993). However, direct measurement can often be difficult to accomplish.

For simplicity and convenience, the triplet state of a compound should be calculated for this invention even though the calculated values for the triplet state energy of a given compound may typically show some deviation from the experimental values. If calculated triplet energy values are unavailable, then experimentally determined values can be used. Because the triplet energies cannot be either calculated or measured accurately in some situations, differences of less than 0.05 should be considered equal for the purposes of this invention.

The calculated triplet state energy for a molecule is derived from the difference between the ground state energy ($E(gs)$) of the molecule and the energy of the lowest triplet state ($E(ts)$) of the molecule, both given in eV. This difference is modified by empirically derived constants whose values were obtained by comparing the result of $E(ts)-E(gs)$ to experimental triplet energies, so that the triplet state energy is given by equation 1:

$$E(t) = 0.84 \times (E(ts) - E(gs)) + 0.35 \quad \text{(eq. 1)}$$

Values of E(gs) and E(ts) are obtained using the B3LYP method as implemented in the Gaussian 98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential may be used. MIDI!, 6-31G* and LANL2DZ are used as implemented in the Gaussian98 computer code and LACV3P is used as implemented in the Jaguar 4.1 (Schrodinger, Inc., Portland, Oreg.) computer code. The energy of each state is computed at the minimum-energy geometry for that state For polymeric or oligomeric materials, it is sufficient to compute the triplet energy over a monomer or oligomer of sufficient size so that additional units do not substantially change the computed triplet energy.

The term "reduction potential" expressed in volts and abbreviated $E^{red}$, measures the affinity of a substance for an electron: the larger (more positive) the number, the greater the affinity. The reduction potential of a substance can be conveniently obtained by cyclic voltammetry (CV) and it is measured vs. SCE. The measurement of the reduction potential of a substance can be as following: An electrochemical analyzer (for instance, a CHI660 electrochemical analyzer, made by CH Instruments, Inc., Austin, Tex.) is employed to carry out the electrochemical measurements. Both CV and Osteryoung square-wave voltammetry (SWV) can be used to characterize the redox properties of the substance. A glassy carbon (GC) disk electrode (A=0.071 cm$^2$) is used as working electrode. The GC electrode is polished with 0.05 µm alumina slurry, followed by sonication cleaning in deionized water twice and rinsed with acetone between the two water cleanings. The electrode is finally cleaned and activated by electrochemical treatment prior to use. A platinum wire can be used as the counter electrode and the SCE is used as a quasi-reference electrode to complete a standard 3-electrode electrochemical cell. A mixture of acetonitrile and toluene (1:1 MeCN/toluene) or methylene chloride (MeCl$_2$) can be used as organic solvent systems. All solvents used are ultra low water grade (<10 ppm water). The supporting electrolyte, tetrabutylammonium tetrafluoroborate (TBAF) is recrystallized twice in isopropanol and dried under vacuum for three days. Ferrocene (Fc) can be used as an internal standard ($E^{red}_{Fc}$=0.50 V vs. SCE in 1:1 MeCN/toluene, $E^{red}_{Fc}$=0.55 V vs. SCE in MeCl$_2$, 0.1 M TBAF, both values referring to the reduction of the ferrocenium radical anion). The testing solution is purged with high purity nitrogen gas for approximately 15 minutes to remove oxygen and a nitrogen blanket is kept on the top of the solution during the course of the experiments. All measurements are performed at an ambient temperature of 25±1° C. If the compound of interest has insufficient solubility, other solvents can be selected and used by those skilled in the art. Alternatively, if a suitable solvent system cannot be identified, the electron accepting material can be deposited onto the electrode and the reduction potential of the modified electrode can be measured.

Similarly, the term "oxidation potential", expressed in volts and abbreviated $E^{ox}$, measures the ability to lose electron from a substance: the larger the value, the more difficult to lose electron. A CV, as discussed above, can also conveniently obtain the oxidation potential of a substance.

The electronic energy level of the Lowest Unoccupied Molecular Orbital (LUMO) of an organic material can be obtained based on the value of the reduction potential of the organic material. The relationship between LUMO energy and the $E^{red}$ is:

$$\text{LUMO(eV)} = -4.8 - e \times (E^{red} \text{ vs. SCE} - E^{red}_{Fc} \text{ vs. SCE}) \qquad \text{(eq. 2)}$$

Similarly, the electronic energy level of the Highest Occupied Molecular Orbital (HOMO) of an organic material can be obtained based on the value of oxidation potential of the organic material. The relationship between LUMO energy and the $E^{ox}$ is:

$$\text{HOMO(eV)} = -4.8 e \times (E^{ox} \text{ vs. SCE} - E^{red}_{Fc} \text{ vs. SCE}) \qquad \text{(eq. 3)}$$

For example, in 1:1 MeCN/toluene, if a material has an $E^{red}$ vs. SCE=−2.0 V and an $E^{ox}$ vs. SCE=1.0 V, the LUMO of the material is −2.3 eV, and the HOMO of the material is −5.3 eV ($E^{red}_{Fc}$=0.50 V vs. SCE in 1:1 MeCN/toluene).

In addition, there are other means to measure LUMO energy, such as inversed photoelectron spectroscopy (IPES); there are other means to measure HOMO energy, such as ultraviolet photoelectron spectroscopy (UPS). LUMO energy is also commonly estimated based on the values of the measured HOMO energy minus the optical band gap of the same material.

Unless otherwise specifically stated when a molecular structure is discussed, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also form further substituted derivatives with any substituent group or groups as herein mentioned, so long as the substituent does not destroy properties necessary for utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)hexanamido, alpha-(4-hydroxy-3-t-butylphenoxy)tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group containing oxygen, nitrogen, sulfur, phosphorous, or boron, such as 2-furyl, 2-thienyl, 2-benzimidazolyloxy or 2-benzothiazolyl; quaternary ammonium, such as triethylammonium; quaternary phosphonium, such as triphenylphosphonium; and silyloxy such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, $12^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group containing cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

The aforementioned terms will be frequently used in the following discussions. The following is the description of the layers, material selection, and fabrication process for the OLED embodiments shown in FIGS. 1-4.

When the desired EL emission is viewed through the anode, anode 110 should be transparent or substantially transparent to the emission of interest. Common transparent anode materials used in this invention are indium-tin oxide to (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 110. For applications where EL emission is viewed only through the cathode 190, the transmissive characteristics of the anode 110 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by ally suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Although it is not always necessary, it is often useful to provide an HIL in the OLEDs. HIL 120 in the OLEDs can serve to facilitate hole injection from the anode into the HTL, thereby reducing the drive voltage of the OLEDs. Suitable materials for use in HIL 120 include, but are not limited to, porphyrinic compounds as described in U.S. Pat. No. 4,720,432 and some aromatic amines, for example, 4,4',4"-tris[(3-ethylphenyl)phenylamino]triphenyl amine (m-TDATA). Alternative hole-injecting materials reportedly useful in OLEDs are described in EP 0 891 121 A1 and EP 1 029 909 A1. Aromatic tertiary amines discussed below can also be useful as hole-injecting materials. Other useful hole-injecting materials such as dipyrazino[2,3-f:2',3'-h]quinoxalinehexacarbonitrile are described in US 2004/0113547 A1 and U.S. Pat. No. 6,720,573. In addition, a p-type doped organic layer is also useful for the HIL as described in U.S. Pat. No. 6,423,429. The term "p-type doped organic layer" means that this layer has semiconducting properties after doping, and the electrical current through this layer is substantially carried by the holes. The conductivity is provided by the formation of a charge-transfer complex as a result of hole transfer from the dopant to the host material.

The thickness of the HIL 120 is in the range of from 0.1 nm to 200 nm, preferably, in the range of from 0.5 nm to 150 nm.

The HTL 130 contains at least one hole-transporting material such as an aromatic tertiary amine, where the latter is understood to be a compound containing at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. Exemplary monomeric triarylamines are illustrated by Klupfel et al. U.S. Pat. No. 3,180,730. U.S. Pat. No. 3,567,450 and U.S. Pat. No. 3,658,520, by Brantley, et al. disclose other suitable triarylamines substituted with one or more vinyl radicals or at least one active hydrogen-containing group.

A more preferred class of aromatic tertiary amines are those which include at least two aromatic tertiary amine moieties as described in U.S. Pat. No. 4,720,432 and U.S. Pat. No. 5,061,569. Such compounds include those represented by structural Formula (A)

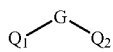

(A)

wherein:
$Q_1$ and $Q_2$ are independently selected aromatic tertiary amine moieties; and
G is a linking group such as an arylene, cycloalkylene, or alkylene group of a carbon-to-carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula (B)

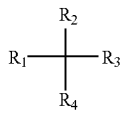

(B)

wherein:
$R_1$ and $R_2$ each independently represents a hydrogen atom, an aryl group, or an alkyl group or $R_1$ and $R_2$ together represent the atoms completing a cycloalkyl group; and
$R_3$ and $R_4$ each independently represents an aryl group, which is in turn substituted with a diaryl substituted amino group, as indicated by structural Formula (C)

(C)

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), and linked through an arylene group. Useful tetraaryldiamines include those represented by Formula (D)

(D)

wherein:
each are is an independently selected arylene group, such as a phenylene or anthracene moiety;
n is an integer of from 1 to 4; and
Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

Another class of the hole-transporting material includes a material of formula (E):

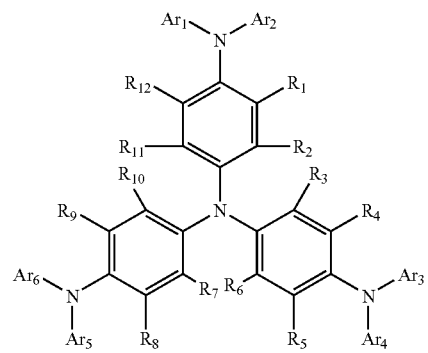

(E)

In formula (E), $Ar_1$—$Ar_6$ independently represent aromatic groups, for example, phenyl groups or tolyl groups; $R_1$—$R_{12}$ independently represent hydrogen or independently selected substituent, for example an alkyl group containing from 1 to 4 carbon atoms, an aryl group, a substituted aryl group.

The various alkyl, alkylene, aryl, and arylene moieties of the foregoing structural Formulae (A), (B), (C), (D), and (E) can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. The aryl and arylene moieties are typically phenyl and phenylene moieties.

The HTL is formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Aromatic tertiary amines are useful as hole-injecting materials also. Illustrative of useful aromatic tertiary amines are the following:

1,1-bis(4-di-p-tolylaminophenyl)cyclohexane;
1,1-bis(4-di-p-tolylaminophenyl)-4-phenylcyclohexane;
1,5-bis[N-(1-naphthyl)-N-phenylamino]naphthalene;

2,6-bis(di-p-tolylamino)naphthalene;
2,6-bis[di-(1-naphthyl)amino]naphthalene;
2,6-bis[N-(1-naphthyl)-N-(2-naphthyl)amino]naphthalene;
2,6-bis[N,N-di(2-naphthyl)amine]fluorene;
4-(di-p-tolylamino)-4'-[4(di-p-tolylamino)-styryl]stilbene;
4,4'-bis(diphenylamino)quadriphenyl;
4,4"-bis[N-(1-anthryl)-N-phenylamino]-p-terphenyl;
4,4'-bis[N-(1-coronenyl)-N-phenylamino]biphenyl;
4,4'-bis[N-(1-naphthyl)-N-phenylamino]biphenyl (NPB);
4,4'-bis[N-(1-naphthyl)-N-(2-naphthyl)amino]biphenyl (TNB);
4,4"-bis[N-(1-naphthyl)-N-phenylamino]p-terphenyl;
4,4'-bis[N-(2-naphthacenyl)-N-phenylamino]biphenyl;
4,4'-bis[N-(2-naphthyl)-N-phenylamino]biphenyl;
4,4'-bis[N-(2-perylenyl)-N-phenylamino]biphenyl;
4,4'-his[N-(2-phenanthryl)-N-phenylamino]biphenyl;
4,4'-bis[N-(2-pyrenyl)-N-phenylamino]biphenyl;
4,4'-bis[N-(3-acenaphthenyl)-N-phenylamino]biphenyl;
4,4'-bis[N-(3-m-ethylphenyl)-N-phenylamino]biphenyl (TPD);
4,4'-bis[N-(8-fluoranthenyl)-N-phenylamino]biphenyl;
4,4'-bis[N-(9-anthryl)-N-phenylamino]biphenyl;
4,4'-bis{N-phenyl-N-[4-(1-naphthyl)-phenyl]amino}biphenyl;
4,4'-bis[N-phenyl-N-(2-pyrenyl)amino]biphenyl;
4,4',4"-tris[(3-methylphenyl)phenylamino]triphenylamine (m-TDATA);
Bis(4-dimethylamino-2-methylphenyl)-phenylmethane;
N-phenylcarbazole;
N,N'-bis[4-([1,1'-biphenyl]-4-ylphenylamino)phenyl]-N,N'-di-1-naphthalenyl-[1,1'-biphenyl]-4,4'-diamine;
N,N'-bis[4-(di-1-naphthalenylamino)phenyl]-N,N'-di-1-naphthalenyl-[1,1'-biphenyl]-4,4'-diamine;
N,N'-bis[4-[(3-methylphenyl)phenylamino]phenyl]-N,N'-diphenyl-[1,1'-biphenyl]-4,4'-diamine;
N,N-bis[4-(diphenylamino)phenyl]-N',N'-diphenyl-[1,1'-biphenyl]-4,4'-diamine;
N,N'-di-1-naphthalenyl-N,N'-bis[4-(1-naphthalenylphenylamino)phenyl]-[1,1'-biphenyl]-4,4'-diamine;
N,N'-di-1-naphthalenyl-N,N'-bis[4-(2-naphthalenylphenylamino)phenyl]-[1,1'-biphenyl]-4,4'-diamine;
N,N,N-tri(p-tolyl)amine;
N,N,N',N'-tetra-p-tolyl-4-4'-diaminobiphenyl;
N,N,N',N'-tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl; and
N,N,N',N'-tetra(2-naphthyl)-4,4"-diamino-p-terphenyl.

Another class of useful hole-transporting materials includes polycyclic aromatic compounds as described in EP 1 009 041. Tertiary aromatic amines with more than two amine groups can be used including oligomeric materials. In addition, polymeric hole-transporting materials are used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The thickness of the HTL 130 is in the range of from 5 nm to 200 nm, preferably, in the range of from 10 nm to 150 nm.

1$^{st}$ EXBL 141 is useful in an OLED employing a phosphorescent dopant (or phosphorescent emitter). When located nearby a phosphorescent LEL on the anode side, it helps to confine triplet excitons without escaping through this layer towards the anode side. In order that the 1$^{st}$ EXBL be capable of confining triplet excitons, the material or materials of this layer should have triplet energies that exceed the triplet energies of the host materials in the phosphorescent LEL 150, (LEL 150 will be discussed thereafter). In some cases it is desirable that the 1$^{st}$ EXBL 141 also help to confine electron-hole recombination events to the LEL by blocking the escape of electrons from the LEL into the 1$^{st}$ EXBL 141.

In addition to having high triplet energy, the 1$^{st}$ EXBL should be capable of transporting holes to a LEL. Thus, a hole-transporting material is desirable to be used in the 1$^{st}$ EXBL. The hole-transporting material for use in the 1$^{st}$ EXBL may be the same or different from a hole-transporting material used in the HTL 130 provided that the triplet energy of the hole-transporting material is greater than the triplet energy of the host in the phosphorescent LEL 150.

The exciton-blocking material used in the 1$^{st}$ EXBL may be selected from compounds containing one or more triarylamine groups, and the triplet energy of these compounds exceeds the triplet energy of the host in the phosphorescent LEL. In order to meet such triplet energy requirements said compounds should not contain aromatic fused rings (e.g. naphthalene).

The substituted triarylamines that function as the exciton-blocking material in the present invention may be selected from compounds having the chemical formula (F):

In formula (F), Are is independently selected from alkyl, substituted alkyl, aryl, or substituted aryl group;

$R_1$—$R_4$ are independently selected aryl groups;

provided that Are and $R_1$—$R_4$ do not include aromatic hydrocarbon fused rings; and n is an integer of from 1 to 4.

In one suitable embodiment the exciton-blocking material includes a material of formula (E) as discussed before:

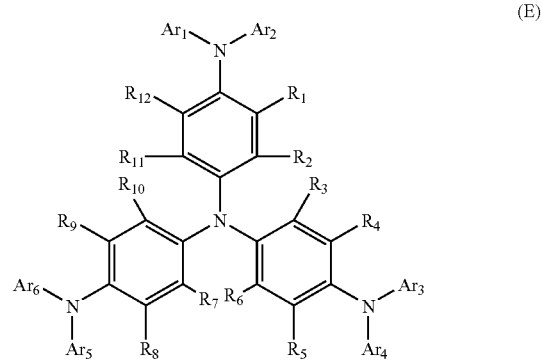

wherein $Ar_1$—$Ar_6$ independently represent aromatic groups, for example, phenyl groups or tolyl groups;

$R_1$—$R_{12}$ independently represent hydrogen or independently selected substituent, for example a alkyl group containing from 1 to 4 carbon atoms, an aryl group, or a substituted aryl group;

provided that $R_1$—$R_{12}$ and $Ar_5$—$Ar_{10}$ do not contain aromatic hydrocarbon fused rings.

Examples of materials useful in the 1st EXBL 141 include, but are not limited to:

4,4',4"-tris[(3-methylphenyl)phenylamino]triphenylamine (MTDATA);

4,4',4"-tris(N,N-diphenyl-amino)triphenylamine (TDATA);

N,N-bis[2,5-dimethyl-4-[(3-methylphenyl)phenylamino]phenyl]-2,5-dimethyl-N'-(3-methylphenyl)-N'-phenyl-1,4-benzenediamine.

In one desirable embodiment the material in the exciton-blocking layer is selected from formula (G):

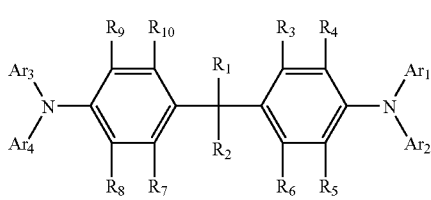

(G)

In formula (G), $R_1$ and $R_2$ represent substituents, provided that $R_1$ and $R_2$ can join to form a ring. For example, $R_1$ and $R_2$ can be methyl groups or join to form a cyclohexyl ring. $Ar_1$—$Ar_4$ represent independently selected aromatic groups, for example phenyl groups or tolyl groups. $R_3$—$R_{10}$ independently represent hydrogen, alkyl, substituted alkyl, aryl, substituted aryl group. In one desirable embodiment, $R_1$—$R_2$, $Ar_1$—$Ar_4$ and $R_3$—$R_{10}$ do not contain fused aromatic rings.

Some non-limiting examples of such materials are:
1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[N,N-bis(4-methylphenyl)-benzenamine;
1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl](4-methylphenyl)methane;
Bis[4-(N,N-diethylamino)-2-methylphenyl](4-methylphenyl)ethane;
4-(4-Diethylaminophenyl)triphenylmethane;
4,4'-Bis(4-diethylaminophenyl)diphenylmethane.

In one suitable embodiment the exciton-blocking material includes a material of formula (H):

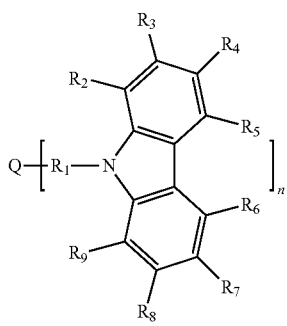

(H)

wherein n is an integer from 1 to 4;
Q is N, C, aryl, or substituted aryl group;
$R_1$ is phenyl, substituted phenyl, biphenyl, substituted biphenyl, aryl or substituted aryl;
$R_2$ through $R_9$ are independently hydrogen, alkyl, phenyl or substituted phenyl, aryl amine, carbazole, or substituted carbazole; provided that $R_2$—$R_9$ do not contain aromatic hydrocarbon fused rings.

It is further desirable that the exciton-blocking material is selected from formula (I):

(I)

wherein n is an integer from 1 to 4;
Q is N, C, aryl, or substituted aryl;
$R_2$ through $R_9$ are independently hydrogen, alkyl, phenyl or substituted phenyl, aryl amine, carbazole, provided that $R_2$—$R_9$ do not contain aromatic hydrocarbon fused rings.

Some non-limiting examples of such materials are:
4-(9H-carbazol-9-yl)-N,N-bis[4-(9H-carbazol-9-yl)phenyl]-benzenamine (TCTA),
4-(3-phenyl-9H-carbazol-9-yl)-N,N-bis[4(3-phenyl-9H-carbazol-9-yl)phenyl]-benzenamine;
9,9'-[5'-[4-(9H-carbazol-9-yl)phenyl][1,1':3',1"-terphenyl]-4,4"-diyl]bis-9H-carbazole.

In one suitable embodiment the exciton-blocking material includes a material of formula (J):

(J)

wherein n is an integer from 1 to 4;
Q is phenyl, substituted phenyl, biphenyl, substituted biphenyl, aryl, or substituted aryl group;
$R_1$ through $R_8$ are independently hydrogen, alkyl, phenyl or substituted phenyl, aryl amine, carbazole, or substituted carbazole;
provided that $R_1$—$R_8$ do not contain aromatic hydrocarbon fused rings.

Non-limiting examples of suitable materials are:
9,9'-(2,2'-dimethyl[1,1'-biphenyl]-4,4'-diyl)bis-9H-carbazole (CDBP);

9,9'-[1,1'-biphenyl]-4,4'-diylbis-9H-carbazole (CBP);
9,9'-(1,3-phenylene)bis-9H-carbazole (mCP);
9,9'-(1,4-phenylene)bis-9H-carbazole;
9,9',9''-(1,3,5-benzenetriyl)tris-9H-carbazole;
9,9'-(1,4-phenylene)bis[N,N,N',N'-tetraphenyl-9H-carbazole-3,6-diamine;
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine;
9-phenyl-9H-carbazole.

An example of a hole-transporting material that satisfy the requirements for the exciton-blocking material used in the 1$^{st}$ EXBL is TCTA, and an example of a hole-transporting material that fails to satisfy the requirements for the exciton-blocking material used in the 1$^{st}$ EXBL is NPB.

The following table lists the HOMO energy, LUMO energy, redox potentials (in volts) and the triplet energy of some representative structures of hole-transporting materials suitable for use as exciton-blocking materials in the phosphorescent OLEDs. All values are in eV unless noted.

| Identifier | HOMO Energy | LUMO Energy | Triplet Energy | Structure |
|---|---|---|---|---|
| EXBM-1 (TCTA) | −5.43 | −1.88 | 2.85 | $E^{ox}=1.3; E^{red}=-2.50$ |
| EXBM-2 (CBP) | −5.58 | −2.13 | 2.67 | $E^{ox}=1.3; E^{red}=-2.34$ |
| EXBM-3 (MCP) | −5.68 | −1.75 | 3.15 | |

-continued

Exciton-Blocking Materials (EXBM)

| Identifier | HOMO Energy | LUMO Energy | Triplet Energy | Structure |
|---|---|---|---|---|
| EXBM-4 | −5.15 | −1.30 | 2.95 | 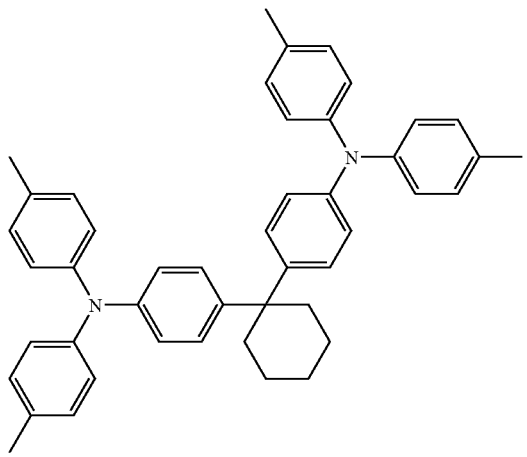 |
| EXBM-5 (m-(TDATA)) | −4.93 | −1.91 | 2.65 | 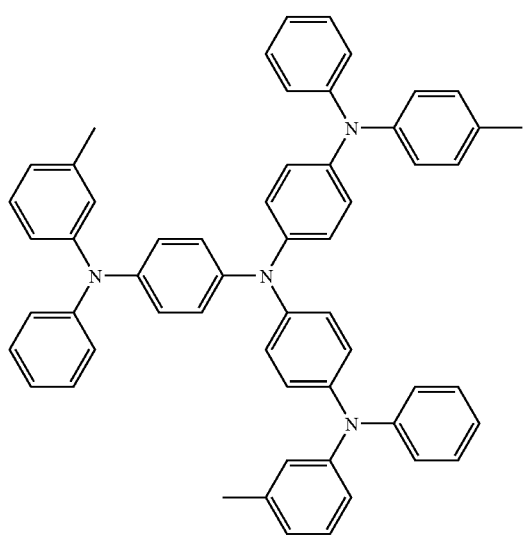 |

The 1$^{st}$ EXBL 141 can be between 1 and 50 nm thick and suitably between 2 and 20 nm thick. The 1$^{st}$ EXBL may include more than one compound, deposited as a blend or divided into separate layers.

When more than one material is present in the 1$^{st}$ EXBL, the triplet energy of the entire layer is considered to be the same as the triplet energy of the predominate material. If two or more materials are present in equal amounts, the triplet energy of the layer is considered to be the same as the triplet energy of the material with the lowest triplet energy relative to the triplet energy of the phosphorescent host.

Although the 1$^{st}$ EXBL 141 can effectively block excitons from diffusing into HTL 130 and can increase quantum efficiency in the phosphorescent OLED, we found that only one exciton-blocking layer cannot fully block exciton diffusion from the phosphorescent LEL 150 into HTL 130. Therefore, 2$^{nd}$ EXBL 142 is very useful in an OLED employing a phosphorescent dopant. The 2$^{nd}$ EXBL 142 is disposed in contact with the phosphorescent LEL 150 on the anode side, and it helps to confine triplet excitons to the LEL. In order that the 2$^{nd}$ EXBL be capable of confining triplet excitons, the material or materials of this layer should have triplet energies that exceed that of the phosphorescent dopant. Otherwise, if the triplet energy level of any material in the 2$^{nd}$ EXBL is lower than that of the phosphorescent dopant, often that material will quench excited states in the LEL, the device luminous efficiency would be decreased. Moreover, it is preferably that the exciton-blocking material used in the 2$^{nd}$ EXBL 142 should have a triplet energy less than the triplet energy of the exciton-blocking material used in the 1$^{st}$ EXBL 141 to create an unfavorable exciton diffusion condition. As a result, the 2$^{nd}$ EXBL 142 enhances the excition-blocking effect and eliminates light emission from the hole-transporting layer.

It is desirable that the second exciton-blocking layer enhances the exciton-blocking effect of the first exciton-blocking layer. This should result in the elimination of any substantial amount of light emission from the hole-transporting layer. Light emission from the hole-transporting layer is undesirable because it represents the fact that the desired excitons are not contained in the light-emitting layer and so, reduces the overall intensity of the intended light emission.

Since the 2$^{nd}$ EXBL should be capable of transporting holes to phosphorescent LEL 150, the 2$^{nd}$ EXBL preferably has an oxidation potential not less than the oxidation potential of the $1^{st}$ EXBL 141, or the HOMO (Highest Occupied Molecular Orbital) level of the $2^{nd}$ EXBL 142 is not higher than that of the $1^{st}$ EXBL 141. Similarly, the $2^{nd}$ EXBL 142 preferably has an oxidation potential greater than the oxidation potential of the phosphorescent LEL 150, or the HOMO level of the $2^{nd}$ EXBL 142 is higher than that of the phosphorescent LEL 150. In this way, holes injected from the anode can easily transport from the $1^{st}$ EXBL 141 to the $2^{nd}$ EXBL 142, and then to the phosphorescent LEL 150.

It is desirable that the $2^{nd}$ EXBL 142 also help to confine electron-hole recombination events to the LEL by blocking the escape of electrons from the LEL into the $2^{nd}$ EXBL 142. Therefore, the $2^{nd}$ EXBL 142 has a reduction potential less than the reduction potential of the host in the phosphorescent LEL 150, or the LUMO (Lowest Unoccupied Molecular Orbital) level of the $2^{nd}$ EXBL 142 is higher than that of the LEL 150 and is closer to the vacuum energy level. In other words, there is in electron escape barrier from the phosphorescent LEL 150 to the $2^{nd}$ EXBL 142.

When more than one material is present in the $2^{nd}$ EXBL, the energy values (of any kind) of the entire layer is considered to be the same as the energy values of the predominate material. If two or more materials are present in equal amounts, the triplet energy of the layer is considered to be the same as the triplet energy of the material with the lowest triplet energy. For the oxidation potential whenever two or more materials are present in equal amounts, it is the material with the lowest oxidation potential. For the same situation in terms of HOMO, it is the material with the highest HOMO. For reduction potential, it is the material with the highest LUMO relative to the phosphorescent host.

The exciton-blocking material used in the $2^{nd}$ EXBL 142 may be selected from the hole-transporting materials used as the exciton-blocking material in the $1^{st}$ EXBL 141 provided that the triplet energy, the HOMO level, and the LUMO energy meet the requirements discussed above. Obviously, the exciton-blocking material used in the $2^{nd}$ EXBL 142 is different from that used in the $1^{st}$ EXBL 141.

An example of a hole-transporting material that satisfy the requirements for the exciton-blocking material used in the $2^{nd}$ EXBL is CBP if the exciton-blocking material used in the $1^{st}$ EXBL is TCTA. An example of a hole-transporting material that fails to satisfy the requirements for the exciton-blocking material used in the $2^{nd}$ EXBL is TCTA if the exciton-blocking material used in the $1^{st}$ EXBL is CBP. (The HOMO energy, LUMO energy, and the triplet energy of TCTA and CBP can be found in the previous table).

The $2^{nd}$ EXBL 142 can be between 1 and 50 nm thick and suitably between 2 and 20 nm thick. The $2^{nd}$ EXBL may include more than one compound, deposited as a blend or divided into separate layers.

The phosphorescent LEL 150 includes at least one host (or host material) and at least one phosphorescent dopant (or dopant material).

Suitable host in the phosphorescent LEL 150 should be selected so that transfer of a triplet exciton can occur efficiently from the host to the phosphorescent dopant(s) but cannot occur efficiently from the phosphorescent dopant(s) to the host. Therefore, it is highly desirable that the triplet energy of the host be higher than the triplet energies of phosphorescent dopant(s). Generally speaking, a large triplet energy implies a large optical band gap. However, the band gap of the host should not be chosen so large as to cause an unacceptable barrier to injection of holes or electrons and an unacceptable increase in the drive voltage of the OLED. The host in the phosphorescent LEL 150 may include the aforementioned hole-transporting material used for the HTL 130, as long as it has a triplet energy higher than that of the phosphorescent dopant in the layer. More important to the present invention, it is desirable that the host in the phosphorescent LEL 150 is an electron-transporting material as long as it has a triplet energy higher than that of the phosphorescent dopant in the phosphorescent LEL 150.

If two or more phosphorescent hosts are present, the triplet energy is considered to be the same as the triplet energy of the predominate host. If two or more hosts are present in equal amounts, the triplet energy of the layer is considered to be the same as the triplet energy of the host with the highest triplet energy.

A desirable electron-transporting host may be any suitable electron transporting compound, such as benzazole, phenanthroline, 1,3,4-oxadiazole, triazole, triazinc, or triarylborane, as long as it has a triplet energy that is higher than that of the phosphorescent dopant to be employed.

A preferred class of benzazoles is described by Shi et al. in U.S. Pat. Nos. 5,645,948 and 5,766,779. Such compounds are represented by structural formula (K):

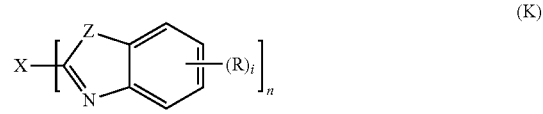

(K)

In formula (K), n is selected from 2 to 8;

Z is independently O, NR or S;

R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring; and X is a linkage unit containing carbon, alkyl, aryl, substituted alkyl, or substituted aryl, which conjugately or unconjugately connects the multiple benzazoles together.

An example of a useful benzazole is 2,2',2''-(1,3,5-phenylene)tris[1-phenyl-1H-benzimidazole] (TPBI) (see Formula K-1) represented as shown below:

K-1
(TPBI)

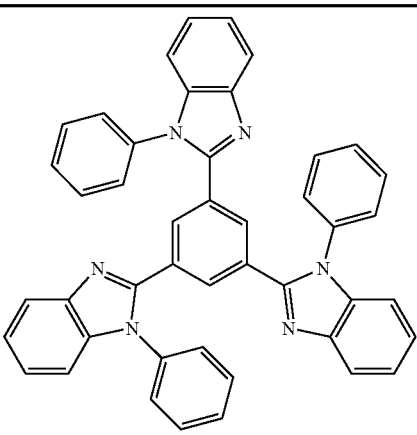

Another class of the electron-transporting materials suitable for use as a host includes various substituted phenanthrolines as represented by formula (L):

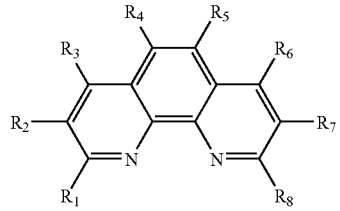

(L)

In formula (L), $R_1$—$R_8$ are independently hydrogen, alkyl group, aryl or substituted aryl group, and at least one of $R_1$—$R_8$ is aryl group or substituted aryl group.

Examples of particularly suitable materials of this class are 2,9-dimethyl-4,7-diphenyl-1,10-phenanthroline (BCP) (see Formula L-1) and 4,7-diphenyl-1,10-phenanthroline (Bphen) (see Formula L-2).

L-1
(BCP)

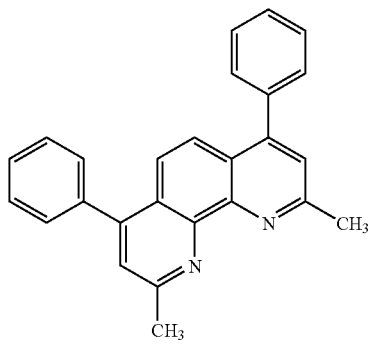

L-2
(Bphen)

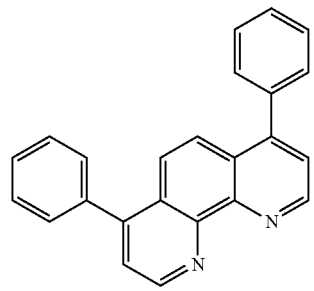

The triarylboranes that function as the electron-transporting host in the present invention may be selected from compounds having the chemical formula (M):

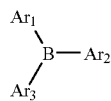

(M-a)

wherein $Ar_1$ to $Ar_3$ are independently an aromatic hydrocarbocyclic group or an aromatic heterocyclic group, which may have a substituent. It is preferable that compounds having the above structure are selected from formula (M-b):

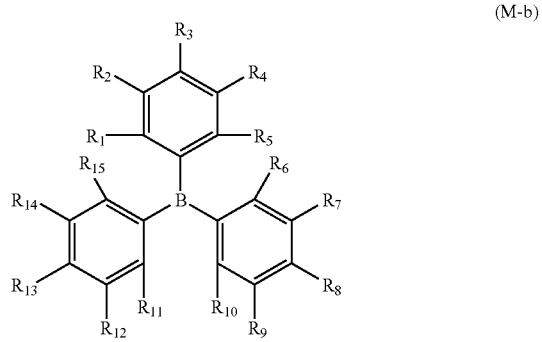

(M-b)

wherein $R_1$—$R_{15}$ are independently hydrogen, fluoro, cyano, trifluoromethyl, sulfonyl, alkyl, aryl or substituted aryl group.

Specific representative embodiments of the triarylboranes include:

M-1

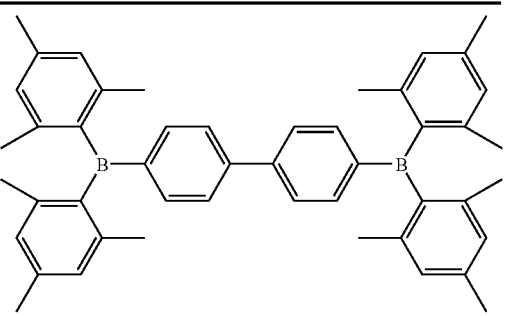

M-2

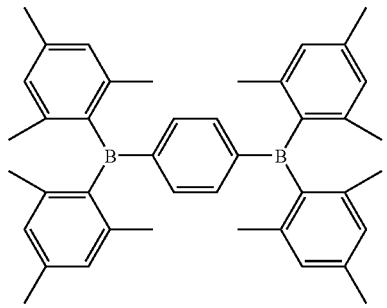

M-3

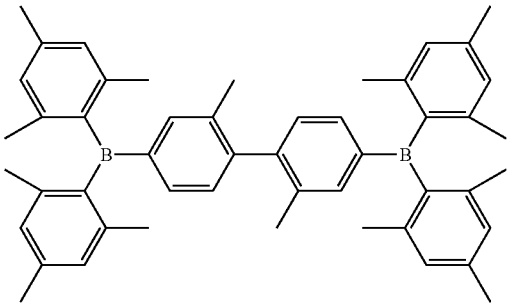

The electron-transporting host in the present invention may be selected from substituted 1,3,4-oxadiazoles. Illustrative of the useful substituted oxadiazoles are the following:

N-1

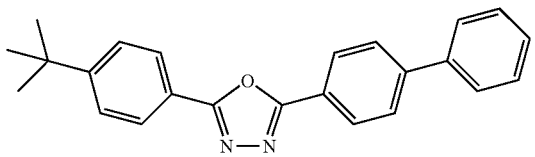

N-2

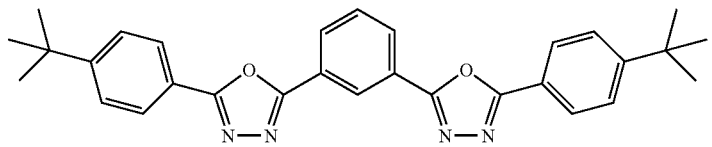

The electron-transporting host in the present invention also may be selected from substituted 1,2,4-triazoles. An example of a useful triazole is 3-phenyl-4-(1-naphtyl)-5-phenyl-1,2,4-triazole:

O-1

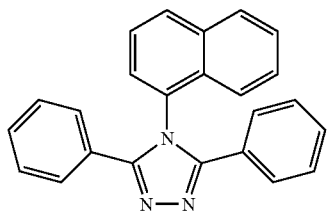

The electron-transporting host in the present invention also may be selected from substituted 1,3,5-triazines. Examples of suitable materials are:

2,4,6-tris(diphenylamino)-1,3,5-triazine;

2,4,6-tricarbazolo-1,3,5-triazine;

2,4,6-tris(N-phenyl-2-naphthylamino)-1,3,5-triazine;

2,4,6-tris(N-phenyl-2-naphthylamino)-1,3,5-triazine;

4,4',6,6'-tetraphenyl-2,2'-bi-1,3,5-triazine;

2,4,6-tris([1,1':3',1''-terphenyl]-5'-yl)-1,3,5-triazine.

The following table lists the HOMO energy, LUMO energy, and the triplet energy of some representative structures of hosts in the phosphorescent LEL 150.

Hosts of Light-Emitting Layer

| Identifier | HOMO Energy | LUMO Energy | Triplet Energy | Structure |
|---|---|---|---|---|
| ETM-1 (TPBI) | −5.79 | −2.09 | 2.69 | 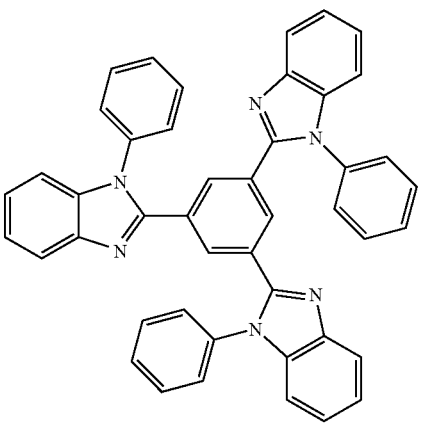 |

$E^{ox} = 1.7; E^{red} = -2.02$

-continued
| Hosts of Light-Emitting Layer | | | | |
|---|---|---|---|---|
| Identifier | HOMO Energy | LUMO Energy | Triplet Energy | Structure |
| ETM-2 | −5.88 | −2.54 | 2.95 | 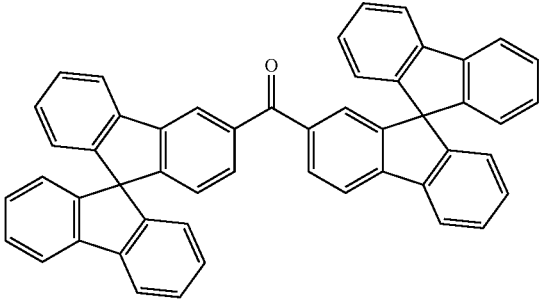 |
| ETM-3 (Bphen) | −6.03 | −2.29 | 2.64 | 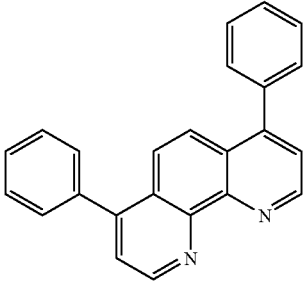 $E^{ox} = 1.8$; $E^{red} = -1.9$ |
| ETM-4 | −5.63 | −2.42 | 2.57 | 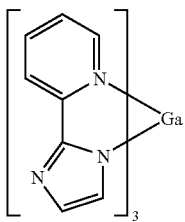 |
| ETM-5 | −5.69 | −2.69 | 2.43 | 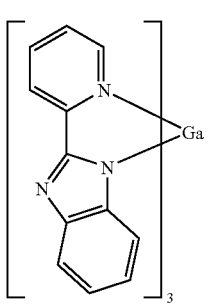 |
| ETM-6 | −5.63 | −2.39 | 2.47 | 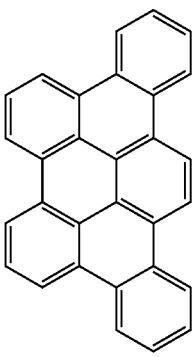 |

-continued

Hosts of Light-Emitting Layer

| Identifier | HOMO Energy | LUMO Energy | Triplet Energy | Structure |
|---|---|---|---|---|
| ETM-7 | −5.55 | −2.26 | 2.47 | |
| ETM-8 | −5.54 | −2.41 | 2.25 | |
| ETM-9 | −5.58 | −2.50 | 2.21 | |
| ETM-10 | −5.74 | −2.57 | 2.29 | |

Hosts of Light-Emitting Layer
| Identifier | HOMO Energy | LUMO Energy | Triplet Energy | Structure |
|---|---|---|---|---|
| ETM-11 (Balq) | −5.50 | −2.53 | 2.25 | 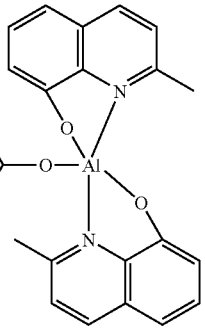 |
| ETM-12 (TBADN) | −5.44 | −2.40 | 1.86 | 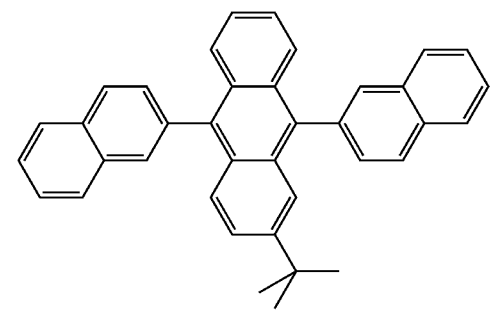 |
| ETM-13 (NPB) | −5.19 | −2.06 | 2.50 | 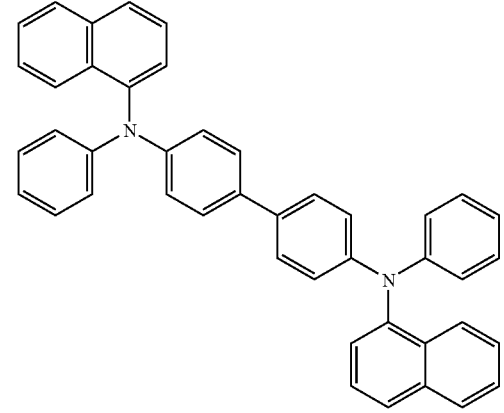 |
| ETM-14 (Bphen) | −6.03 | −2.29 | 2.64 | 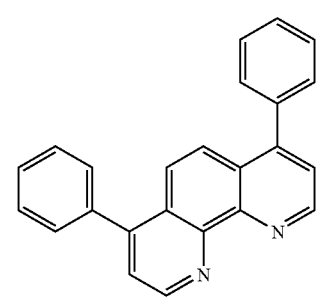 |
| ETM-15 (ALQ) | −5.36 | −2.51 | 2.11 | 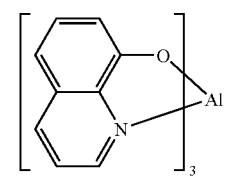 |

Hosts of Light-Emitting Layer

| Identifier | HOMO Energy | LUMO Energy | Triplet Energy | Structure |
|---|---|---|---|---|
| ETM-16 (rubrene) | −5.17 | −2.85 | 1.24 | |
| ETM-17 (ADN) | −5.49 | −2.45 | 1.84 | |
| ETM-18 (BCP) | −5.91 | −2.16 | 2.61 | |
| ETM-19 | −5.58 | −2.30 | 2.76 | |

The phosphorescent dopant in the phosphorescent LEL 150 typically presents in an amount of from 1 to 25% by volume of the light-emitting layer, and conveniently from 2 to 10% by volume of the light-emitting layer. In some embodiments, the phosphorescent complex guest material(s) may be attached to one or more host materials. The host materials may further be polymers. For convenience, the phosphorescent complex guest material also may be referred to herein as a phosphorescent dopant.

Particularly useful phosphorescent dopants are described by Formula (P) below.

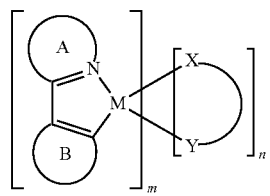

(P)

wherein:
A is a substituted or unsubstituted heterocyclic ring containing at least one N atom;
B is a substituted or unsubstituted aromatic or heteroaromatic ring, or ring containing a vinyl carbon bonded to M;
X—Y is all anionic bidentate ligand;
m is all integer from 1 to 3; and
n in an integer from 0 to 2 such that m+n=3 for M=Rh or Ir; or m is an integer from 1 to 2 and n in an integer from 0 to 1 such that m+n=2 for M=Pt or Pd.

Compounds according to Formula (P) may be referred to as C,N-cyclometallated complexes to indicate that the central metal atom is contained in a cyclic unit formed by bonding the metal atom to carbon and nitrogen atoms of one or more ligands. Examples of heterocyclic ring A in Formula (P) include substituted or unsubstituted pyridine, quinoline, isoquinoline, pyrimidine, indole, indazole, thiazole, and oxazole rings. Examples of ring B in Formula (P) include substituted or unsubstituted phenyl, napthyl, thienyl, benzothienyl, furanyl rings. Ring B in Formula (P) may also be a N-containing ring such as pyridine, with the proviso that the N-containing ring bonds to M through a C atom as shown in Formula (P) and not the N atom.

An example of a tris-C,N-cyclometallated complex according to Formula (P) with m=3 and n=0 is tris(2-phenylpyridinato-N,$C^{2'}$—)Iridium(III), shown below in stereodiagrams as facial (fac-) or meridional (mer-) isomers.

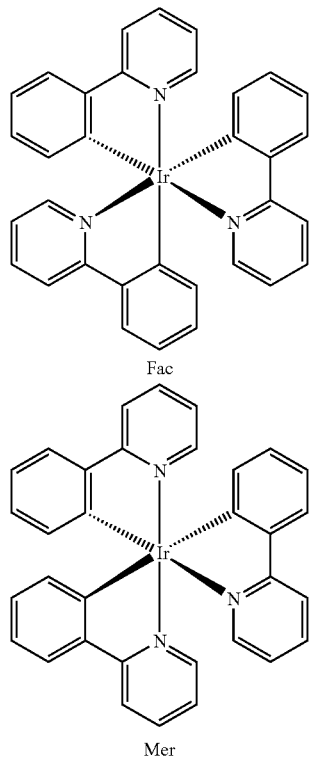

Fac

Mer

Generally, facial isomers are preferred since they are often found to have higher phosphorescent quantum yields than the meridional isomers. Additional examples of tris-C,N-cyclometallated phosphorescent dopants according to Formula (P) are tris(2-(4'-methylphenyl)pyridinato-N,$C^{2'}$)Iridium(III), tris(3-phenylisoquinolinato-N,$C^{2'}$)Iridium(III), tris(2-phenylquinolinato-N,$C^{2'}$)Iridium(III), tris(1-phenylisoquinolinato-N,$C^{2'}$)Iridium(III), tris(1-(4'-methylphenyl)isoquinolinato-N,$C^{2'}$)Iridium(III), tris(2-(4',6'-difluorophenyl)-pyridinato-N,$C^{2'}$)Iridium(III), tris(2-(5'-phenyl-4',6'-difluorophenyl)-pyridinato-N,$C^{2'}$)Iridium(III), tris(2-(5'-phenyl-phenyl)pyridinato-N,$C^{2'}$)Iridium(III), tris(2-(2'-benzothienyl)pyridinato-N,$C^{3'}$)Iridium(III), tris(2-phenyl-3,3'-dimethyl)indolato-N,$C^{2'}$)Ir(III),tris(1-phenyl-1H-indazolato-N,$C^{2'}$)Ir(III).

Tris-C,N-cyclometallated phosphorescent dopants also include compounds according to Formula (P) wherein the monoanionic bidentate ligand X—Y is another C,N-cyclometallating ligand. Examples include bis(1-phenylisoquinolinato-N,$C^{2'}$)(2-phenylpyridinato-N,$C^{2'}$)Iridium(III), bis(2-phenylpyridinato-N,$C^{2'}$)(1-phenylisoquinolinato-N,$C^{2'}$)Iridium(III), bis(1-phenylisoquinolinato-N,$C^{2'}$)(2-phenyl-5-methyl-pyridinato-N,$C^{2'}$)Iridium(III), bis(1-phenylisoquinolinato-N,$C^{2'}$)(2-phenyl-4-methyl-pyridinato-N,$C^{2'}$)Iridium(III), and bis(1-phenylisoquinolinato-N,$C^{2'}$)(2-phenyl-3-methyl-pyridinato-N,$C^{2'}$)Iridium(III).

Structural formulae of some tris-C,N-cyclometallated Iridium complexes are shown below.

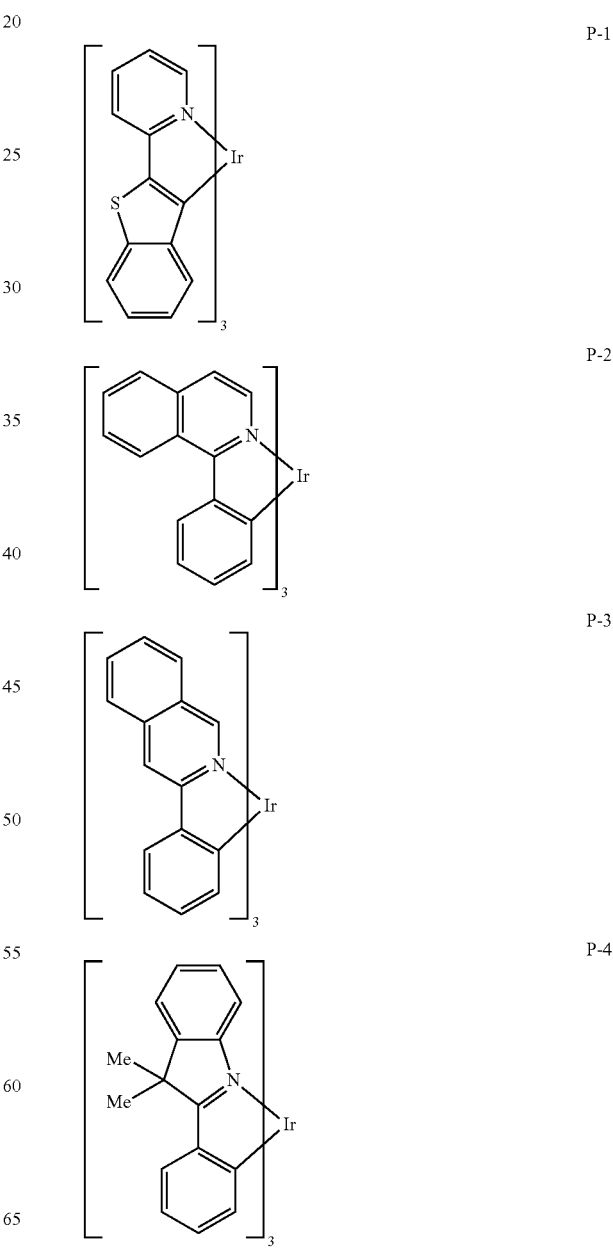

P-5 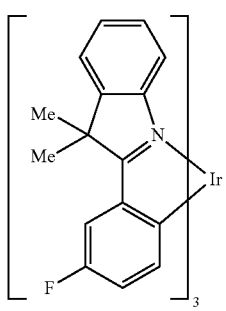
P-6 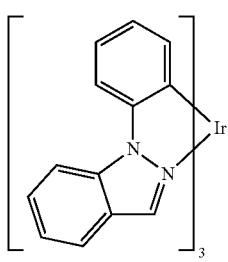
P-7 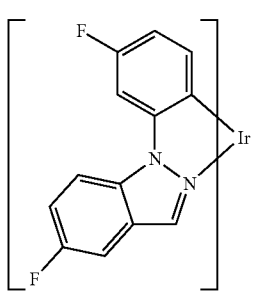
P-8 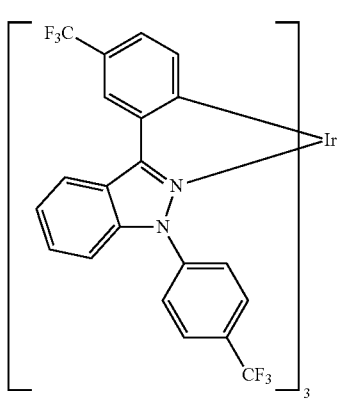
P-9 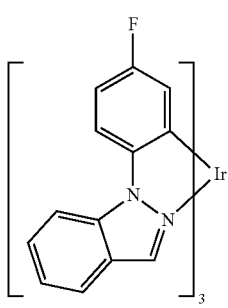
P-10 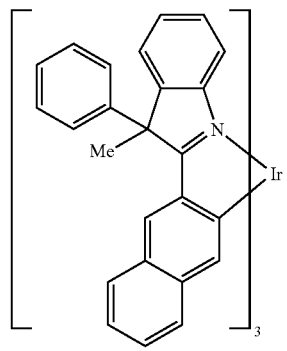
P-11 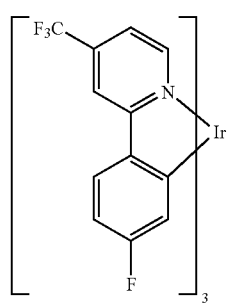
P-12 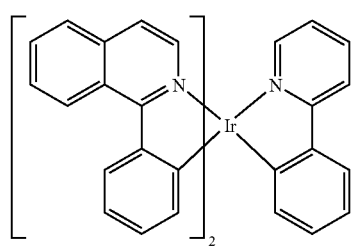
P-13 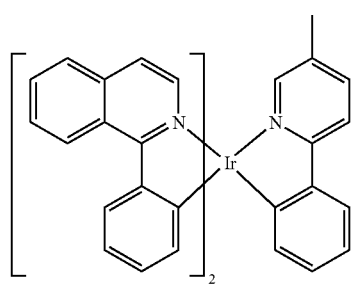
P-14 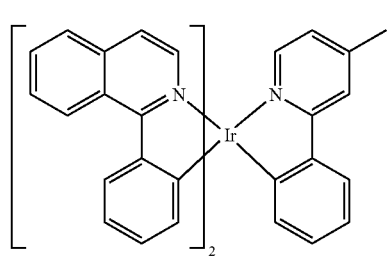

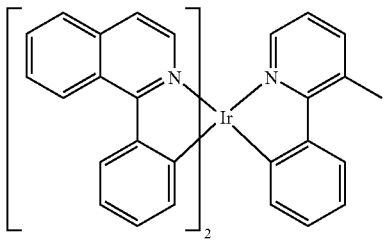

Suitable phosphorescent dopants according to Formula (P) may in addition to the C,N-cyclometallating ligand(s) also contain monoanionic bidentate ligand(s) X—Y that are not C,N-cyclometallating. Common examples are beta-diketonates such as acetylacetonate, and Schiff bases such as picolinate. Examples of such mixed ligand complexes according to Formula (P) include bis(2-phenylpyridinato-N,C$^{2'}$)Iridium (III)(acetylacetonate), bis(2-(2'-benzothienyl)pyridinato-N, C$^{3'}$)Iridium(III)(acetylacetonate), and bis(2-(4',6'-difluorophenyl)-pyridinato-N,C$^{2'}$)Iridium(III)(picolinate).

Other important phosphorescent dopants according to Formula (P) include C,N-cyclometallated Pt(II) complexes such as cis-bis(2-phenylpyridinato-N,C$^{2'}$)platinum(II), cis-bis(2-(2'-thienyl)pyridinato-N,C$^{3'}$) platinum(II), cis-bis(2-(2'-thienyl)quinolinato-N,C$^{5'}$)platinum(II), or (2-(4',6'-difluorophenyl)pyridinato-N,C$^{2'}$)platinumn(II)(acetylacetonate).

In addition to bidentate C,N-cyclometallating complexes represented by Formula (P), many suitable phosphorescent emitters contain multidentate C,N-cyclometallating ligands. Phosphorescent emitters having tridentate ligands suitable for use in the present invention are disclosed in U.S. Pat. No. 6,824,895 B1 and U.S. Ser. No. 10/729,238 (pending) and references therein, incorporated in their entirety herein by reference. Phosphorescent dopants having tetradentate ligands suitable for use in the present invention are described by the following formulae:

(P-T-a)

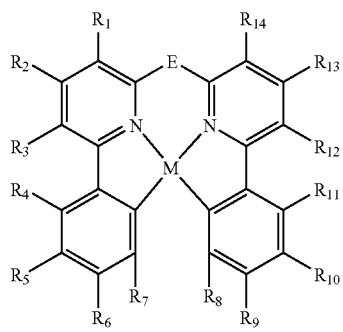

(P-T-b)

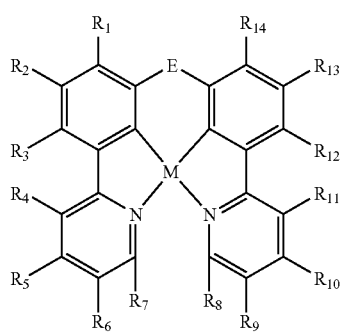

wherein:

M is Pt or Pd;

$R^1$—$R^7$ represent hydrogen or independently selected substituents, provided that $R^1$ and $R^2$, $R^2$ and $R^3$, $R^3$ and $R^4$, $R^4$ and $R^5$, $R^5$ and $R^6$, as well as $R^6$ and $R^7$ may join to form a ring group;

$R^8$—$R^{14}$ represent hydrogen or independently selected substituents, provided that $R^8$ and $R^9$, $R^9$ and $R^{10}$, $R^{10}$ and $R^{11}$, $R^{11}$ and $R^{12}$, $R^{12}$ and $R^{13}$, as well as $R^{13}$ and $R^{14}$ may join to form a ring group;

E represents a bridging group selected from the following:

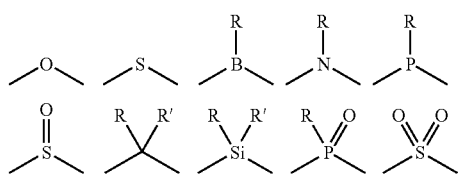

wherein R and R' represent hydrogen or independently selected substituents; provided R and R' may combine to form a ring group.

In one desirable embodiment, the tetradentate C,N-cyclometallated phosphorescent emitter suitable for use in the present invention is represented by the following formula:

(P-T-c)

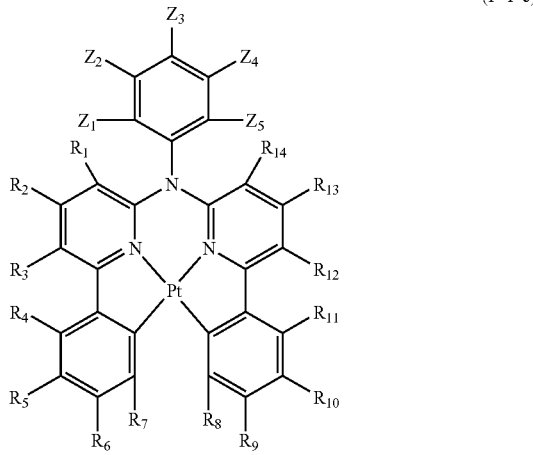

wherein, $R^1$—$R^7$ represent hydrogen or independently selected substituents, provided that $R^1$ and $R^2$, $R^2$ and $R^3$, $R^3$ and $R^4$, $R^4$ and $R^5$, $R^5$ and $R^6$, as well as $R^6$ and $R^7$ may combine to form a ring group;

$R^8$—$R^{14}$ represent hydrogen or independently selected substituents, provided that $R^8$ and $R^9$, $R^9$ and $R^{10}$, $R^{10}$ and $R^{11}$, $R^{11}$ and $R^{12}$, $R^{12}$ and $R^{13}$, as well as $R^{13}$ and $R^{14}$ may combine to form a ring group;

$Z^1$—$Z^5$ represent hydrogen or independently selected substituents, provided that $Z^1$ and $Z^2$, $Z^2$ and $Z^3$, $Z^3$ and $Z^4$, as well as $Z^4$ and $Z^5$ may combine to form a ring group.

Examples of phosphorescent dopants having tetradentate C,N-cyclometallating ligands include the compounds represented below.

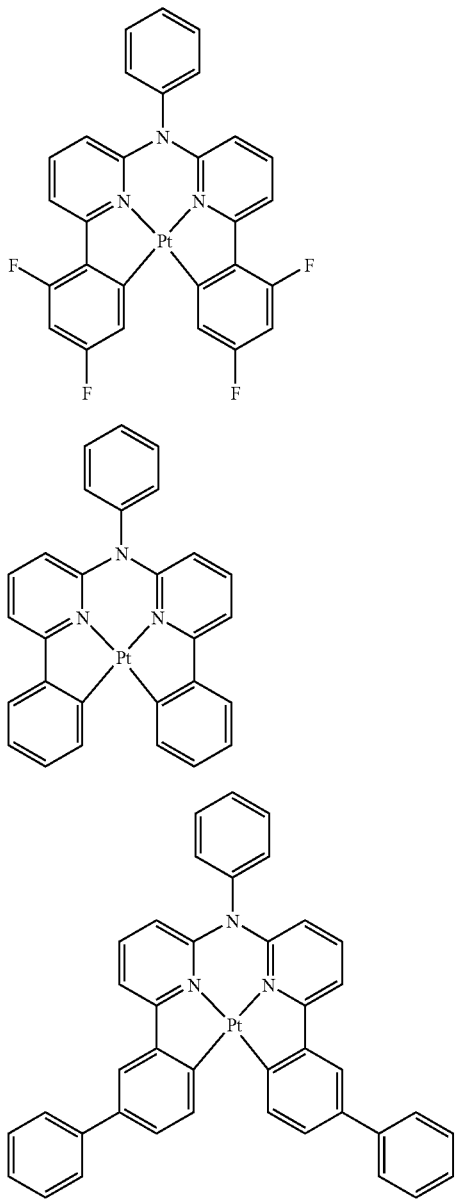

The emission wavelengths (color) of C,N-cyclometallated phosphorescent dopants according to Formulas (P), (P-T-a), (P-T-b) and (P-T-c) are governed principally by the lowest energy optical transition of the complex and hence by the choice of the C,N-cyclometallating ligand. For example, 2-phenyl-pyridinato-N,$C^{2'}$ complexes are typically green emissive while 1-phenyl-isoquinolinolato-N,$C^{2'}$ complexes are typically red emissive. In the case of complexes having more than one C,N-cyclometallating ligand, the emission will be that of the ligand having the property of longest wavelength emission. Emission wavelengths may be further shifted by the effects of substituent groups on the C,N-cyclometallating ligands. For example, substitution of electron donating groups at appropriate positions on the N-containing ring A or electron withdrawing groups on the C-containing ring B tend to blue-shift the emission relative to the unsubstituted C,N-cyclometallated ligand complex. Selecting a monodentate anionic ligand X,Y in Formula (P) having more electron withdrawing properties also tends to blue-shift the emission of a C,N-cyclometallated ligand complex. Examples of complexes having both monoanionic bidentate ligands possessing electron-withdrawing properties and electron-withdrawing substituent groups on the C-containing ring B include bis(2-(4',6'-(difluorophenyl)-pyridinato-N,$C^{2'}$)iridium(III)(picolinate); bis(2-[4''-trifluoromethyl-5'-phenyl-(4',6'-difluorophenyl)-pyridinato-N,$C^{2'}$)Iridium(III)(picolinate); bis(2-(5'-phenyl-4',6'-difluorophenyl)-pyridinato-N,$C^{2'}$)iridium(III)(picolinate); bis(2-(5'-cyano-4',6'-difluorophenyl)-pyridinato-N,$C^{2'}$)iridium(III)(picolinate); bis(2-(4',6'-difluorophenyl)-pyridinato-N,$C^{2'}$)iridium(III) (tetrakis(1-pyrazolyl)borate); bis[2-(4',6'-difluorophenyl)-pyridinato-N,$C^{2'}$]{2-[(3-trifluoromethyl)-1H-pyrazol-5-yl] pyridinato-N,N'}iridium(III); bis[2-(4',6'-difluorophenyl)-4-methylpyridinato-N,$C^{2'}$]{2-[(3-trifluoromethyl)-1H-pyrazol-5-yl]pyridinato-N, N'}iridium(III); and bis[2-(4',6'-difluorophenyl)-4-methoxypyridinato-N,$C^{2'}$]{2-[(3-trifluoromethyl)-1H-pyrazol-5-yl]pyridinato-N,N' }iridium(III).

The central metal atom in phosphorescent dopants according to Formula (P) may be Rh or Ir for (m+n=3) and Pd or Pt (m+n=2). Preferred metal atoms are Ir and Pt since these tend to give higher phosphorescent quantum efficiencies according to the stronger spin-orbit coupling interactions generally obtained with elements in the third transition series.

Other phosphorescent dopants that do not involve C,N-cyclometallating ligands are known. Phosphorescent complexes of Pt(II), Ir(I), and Rh(I) with maleonitriledithiolate have been reported (Johnson et al, *J. Am. Chem. Soc.* 105, 1795-1802 (1983)). Re(I) tricarbonyl diimine complexes are also known to be highly phosphorescent (Wrighton and Morse, *J. Am. Chem. Soc.*, 96, 998-1003 (1974); Stufkens, *Comments Inorg. Chem.*, 13, 359-385 (1992); Yam. *Chem. Commun.*, 2001, 789-796)). Os(II) complexes containing a combination of ligands including cyano ligands and bipyridyl or phenanthroline ligands have also been demonstrated in a polymer OLED (Ma et al, *Synthetic Metals*, 94, 245-248 (1998)).

Porphyrin complexes such as 2,3,7,8,12,13,17,18-octaethyl-21H,23H-porphine platinum(II) are also useful phosphorescent dopants.

Still other examples of useful phosphorescent dopants include coordination complexes of the trivalent lanthanides such as $Tb^{3+}$ and $Eu^{3+}$ (Kido et al., *Chem. Lett.*, 657 (1990); *J. Alloys and Compounds*, 192, 30-33 (1993); *Jpn J. Appl Phys*, 35, 1,394-6 (1996) and *Appl. Phys. Lett.*, 65, 2124 (1994)).

Additional information on suitable phosphorescent dopants, incorporated herein by reference, can be found in U.S. Pat. No. 6,303,238 B1, WO 00/57676, WO 00/70655, WO 01/41512 A1, US 2002/0182441 A1, US 2003/0017361 A1, US 2003/0072964 A1, U.S. Pat. No. 6,413,656 B1, U.S. Pat. No. 6,687,266 B1, US 2004/0086743 A1, US 2004/0121184 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, U.S. Pat. No. 6,677, 060 B2, US 2003/0235712 A1, US 2004/0013905 A1, U.S. Pat. No. 6,733,905 B2, U.S. Pat. No. 6,780,528 B2, US 2003/ 0040627 A1, JP 2003059667A, JP 2003073665A, US 2002/ 0121638 A1, EP 1371708A1, US 2003/010877 A1, WO 03/040256 A2, US 2003/0096138 A1, US 2003/0173896 A1, U.S. Pat. No. 6,670,645 B2, US 2004/0068132 A1, WO 2004/ 015025 A1, US 2004/0072018 A1, US 2002/0134984 A1, WO 03/079737 A2, WO 2004/020448 A1, WO 03/091355 A2, U.S. Ser. No. 10/729,402, U.S. Ser. No. 10/729,712, U.S.

Ser. No. 10/729,738, U.S. Ser. No. 10/729,238, U.S. Pat. No. 6,824,895 B1, U.S. Ser. No. 10/729,207 (now allowed), and U.S. Ser. No. 10/729,263 (now allowed).
The HOMO energy, LUMO energy, and the triplet energy of some suitable phosphorescent dopants are shown in the table below:
| | Phosphorescent Dopants | | | |
|---|---|---|---|---|
| Identifier | HOMO Energy | LUMO Energy | Triplet Energy | Structure |
| Ir(ppy)$_3$ | −5.27 | −2.10 | 2.54 | 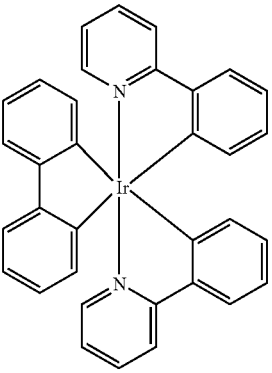 $E^{ox} = 0.77$; $E^{red} = -2.27$ |
| Ir(piq)$_3$ | −5.24 | −2.63 | 2.12 | 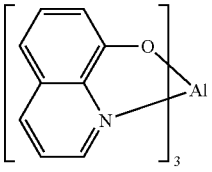 |
| OEPPT | −5.40 | −2.67 | 2.13 | 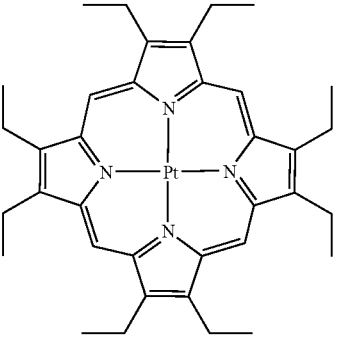 |
| Ir(ppy)$_2$coul | −5.45 | −2.33 | 2.36 | 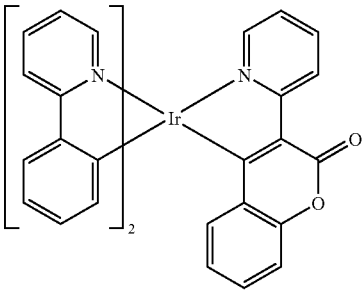 |

Phosphorescent Dopants

| Identifier | HOMO Energy | LUMO Energy | Triplet Energy | Structure |
| --- | --- | --- | --- | --- |
| Ir(cou2)2ppy | −5.39 | −2.48 | 2.51 | 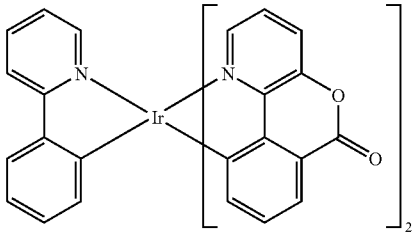 |

As an example, the phosphorescent dopant in the phosphorescent LEL may be selected from tris(1-phenylisoquinoline)iridium(III)(Ir(piq)$_3$), Ir(ppy)$_2$cou1, Ir(cou2)$_2$ppy or tris(2-phenylpyridine)iridium(III)(Ir(ppy)$_3$).

Phosphorescent LEL 150 includes one phosphorescent dopant selected from phosphorescent materials with different colors. Phosphorescent LEL 150 also can include two phosphorescent dopants selected from phosphorescent light-emitting materials with different colors. Furthermore, phosphorescent LEL 150 also can produce white light.

The thickness of the phosphorescent LEL 150 is greater than 0.5 nm, preferably, in the range of from 1.0 nm to 40 nm.

The ETL 170 contains at least one electron-transporting material such as benzazole, phenanthroline, 1,3,4-oxadiazole, triazole, triazine, or triarylborane as discussed in the phosphorescent LEL 150. For example, these electron-transporting materials have the molecular structures of Formula K, Formula L, Formula M-a, M-b, Formula N-1 and N-2, and Form O-1 as discussed previously.

In addition to the aforementioned electron-transporting materials, the electron-transporting materials for use in the ETL 170 may also be selected from, but are not limited to, chelated oxinoid compounds, anthracene derivatives, pyridine-based materials, imidazoles, oxazoles, thiazoles and their derivatives, polybenzobisazoles, cyano-containing polymers and perfluorinated materials.

For example, the electron-transporting materials for use in the ETL 170 may be a metal chelated oxinoid compound including chelates of oxine itself (also commonly referred to as 8-quinolinol or 8-hydroxyquinoline). Exemplary of contemplated oxinoid compounds are those satisfying structural Formula (R)

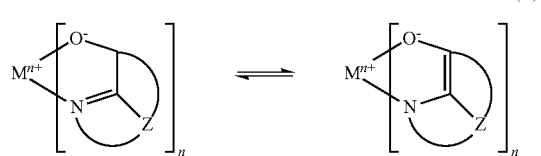

(R)

wherein:
  M represents a metal;
  n is an integer of from 1 to 4; and
  Z independently in each occurrence represents the atoms completing a nucleus having at least two fused aromatic rings.

Particularly useful electron-transporting aluminum or gallium complex host materials are represented by Formula (R-a).

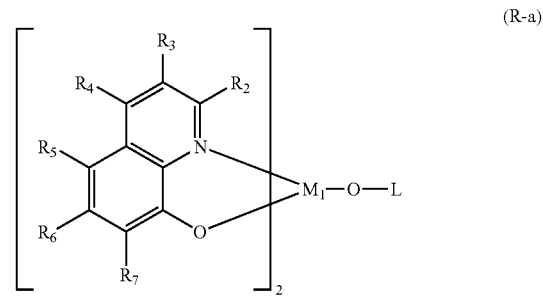

(R-a)

In Formula (R-a), M$_1$ represents Al or Ga. R$_2$—R$_7$ represent hydrogen or an independently selected substituent. Desirably, R$_2$ represents an electron-donating group. Suitably, R$_3$ and R$_4$ each independently represent hydrogen or an electron donating substituent. A preferred electron-donating group is alkyl such as methyl. Preferably, R$_5$, R$_6$, and R$_7$ each independently represent hydrogen or an electron-accepting group. Adjacent substituents, R$_2$—R$_7$, may combine to form a ring group. L is an aromatic moiety linked to the aluminum by oxygen, which may be substituted with substituent groups such that L has from 6 to 30 carbon atoms.

Illustrative of useful chelated oxinoid compounds for use in the ETL 170 are the following:
  R-1: Aluminum trisoxine [alias, tris(8-quinolinolato)aluminum(III) or Alq or Alq3];
  R-2: Magnesium bisoxine [alias, bis(8-quinolinolato)magnesium(II)];
  R-3: Bis[benzo{f}-8-quinolinolato]zinc(II);
  R-4: Bis(2-methyl-8-quinolinolato)aluminum(III)-μ-oxo-bis(2-methyl-8-quinolinolato)aluminum(III);
  R-5: Indium trisoxine [alias, tris(8-quinolinolato)indium];
  R-6: Aluminum tris(5-methyloxine)[alias, tris(5-methyl-8-quinolinolato)aluminum(III)];
  R-7: Lithium oxine [alias, (8-quinolinolato)lithium(I)];
  R-8: Gallium oxine [alias, tris(8-quinolinolato)gallium(III)]; and
  R-9: Zirconium oxine [alias, tetra(8-quinolinolato)zirconium(IV)]
  R-a-1: Aluminum(III)bis(2-methyl-8-hydroxyquinoline)-4-phenylphenolate [alias, Balq].

As another example, anthracene derivatives according to Formula (S) is useful in the ETL 170:

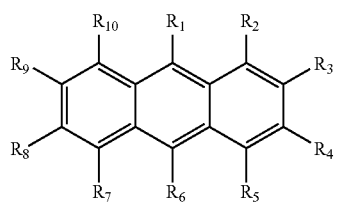
(S)
wherein $R_1$—$R_{10}$ are independently chosen from hydrogen, alkyl groups for 1-24 carbon atoms or aromatic groups from 1-24 carbon atoms. Particularly preferred are compounds where $R_1$ and $R_6$ are phenyl, biphenyl or napthyl, $R_3$ is phenyl, substituted phenyl or napthyl and $R_2$, $R_4$, $R_5$, $R_7$—$R_{10}$ are all hydrogen. Some illustrative examples of suitable anthracenes are:
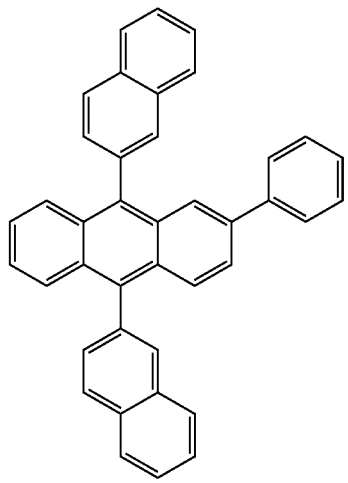
(S-3)
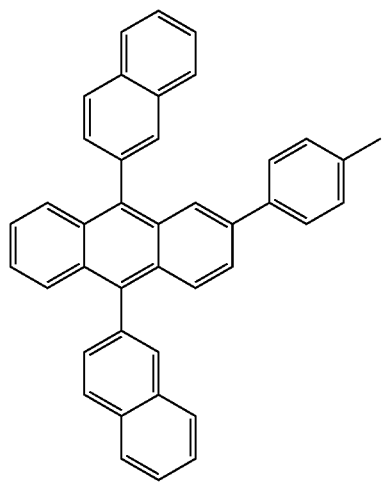
(S-1)
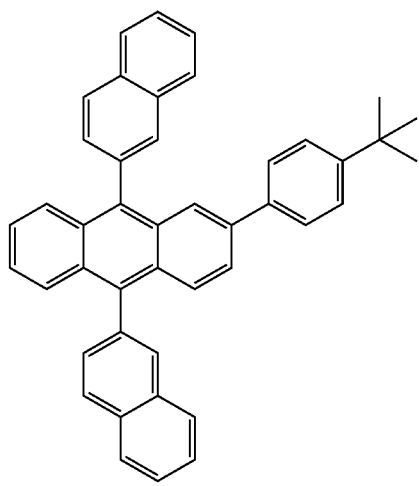
(S-4)
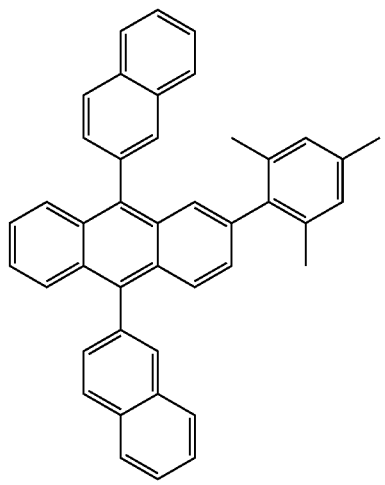
(S-5)
(S-2)

(S-6)
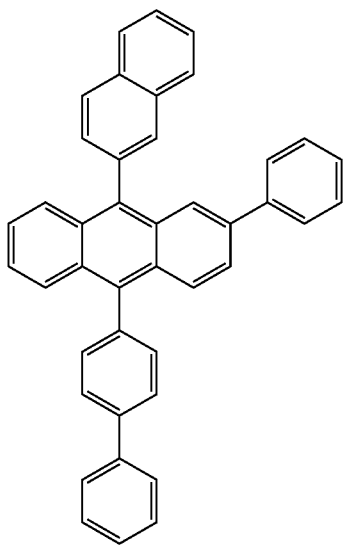
(S-9)
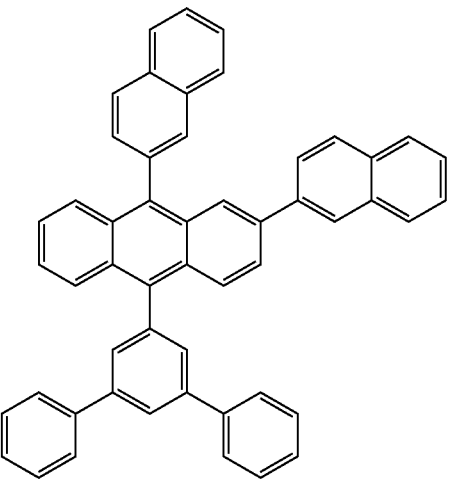
(S-7)
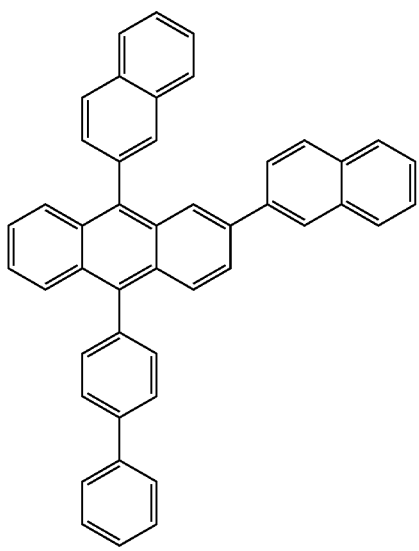
(S-10)
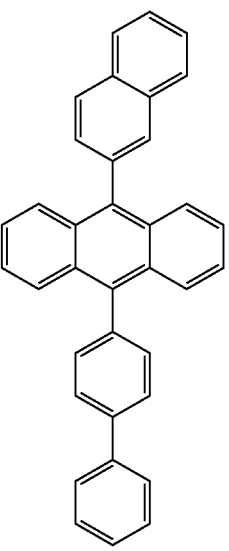
(S-8)
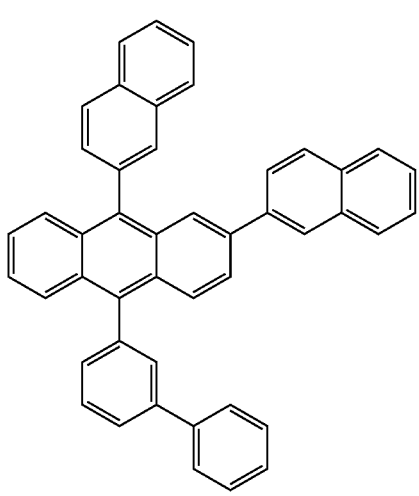
(S-11)
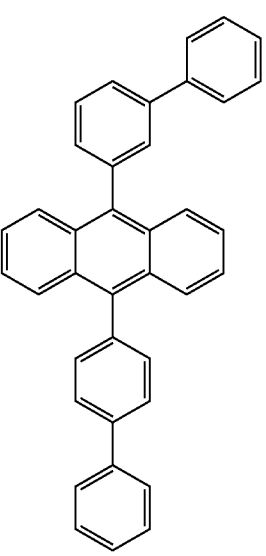

(S-12)
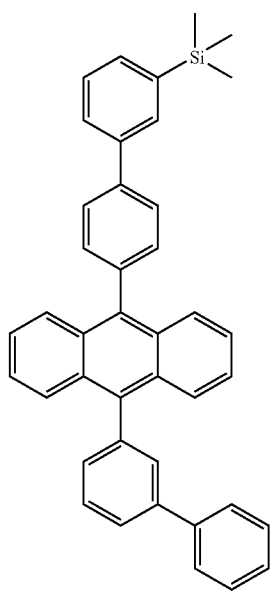
(S-14)
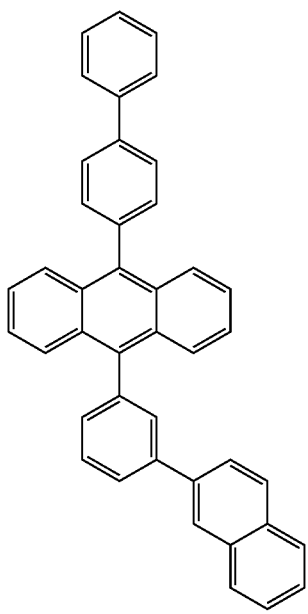
(S-13)
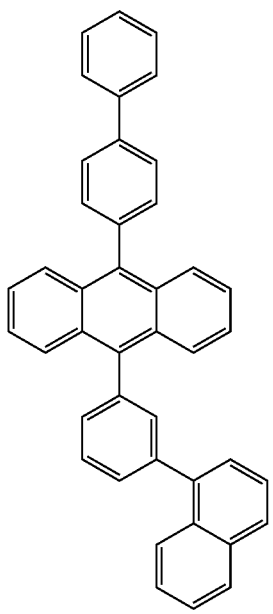
(S-15)
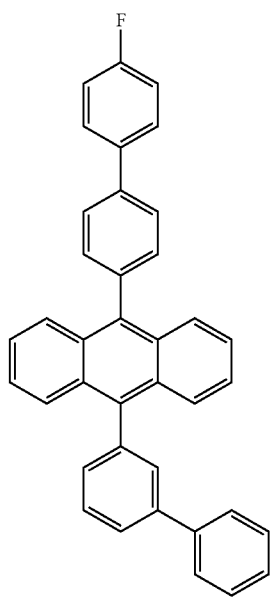

-continued
-continued
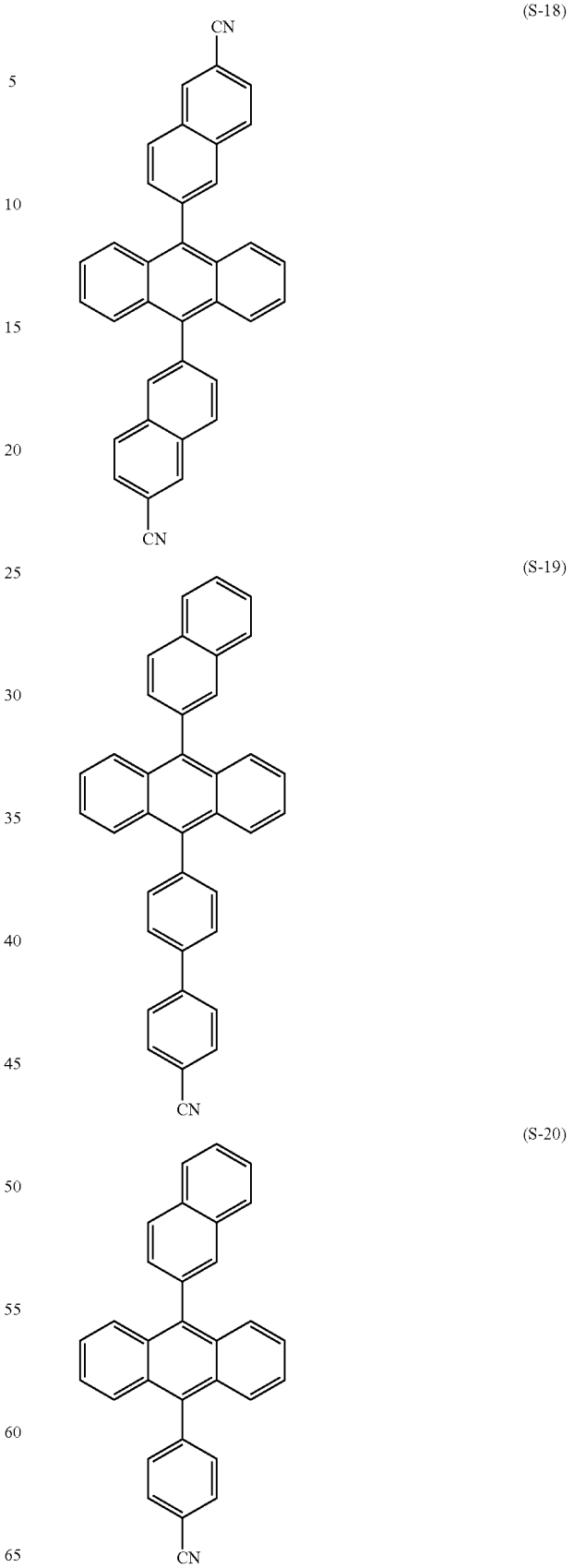
(S-16)
(S-17)
(S-18)
(S-19)
(S-20)

The thickness of the ETL 170 is in the range of from 5 nm to 200 nm, preferably, in the range of from 10 nm to 150 nm.

EIL 180 may be an n-type doped layer containing at least one electron-transporting material as a host and at least one n-type dopant. The dopant is capable of reducing the host by charge transfer. The term "n-type doped layer" means that this layer has semiconducting properties after doping and the electrical current through this layer is substantially carried by the electrons.

The host in EIL 180 is an electron-transporting material capable of supporting electron injection and electron transport. The electron-transporting material can be selected from the electron-transporting materials for use in the ETL region as defined above.

The n-type dopant in the n-type doped EIL 180 is selected from alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped EIL 180 also include organic reducing agents with strong electron-donating properties. By "strong electron-donating properties" it is meant that the organic (dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant is any of the above or also a material molecularly dispersed or copolymerized with the host as a minor component. Preferably, the n-type dopant in the n-type doped EIL 180 includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20% by volume of this layer. The thickness of the n-type doped EIL 180 is typically less than 200 nm, and preferably in the range of less than 150 nm.

EIL 180 may also include alkaline metal complexes or alkaline earth metal complexes. Wherein, the metal complex in the electron-injecting layer includes a cyclometallated complex represented by Formula (T)

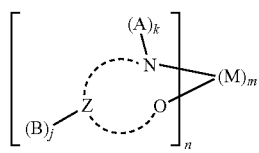

(T)

wherein:

Z and the dashed are represent two or three atoms and the bonds necessary to complete a 5- or 6-membered ring with M;

each A represents H or a substituent and each B represents an independently selected substituent on the Z atoms, provided that two or more substituents may combine to form a fused ring or a fused ring system;

j is 0-3 and k is 1 or 2;

M represents an alkali metal or an alkaline earth metal; and m and n are independently selected integers selected to provide a neutral charge on the complex.

Illustrative examples of useful electron-injecting materials include, hut are not limited to, the following:

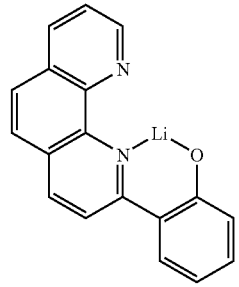

(T-1)

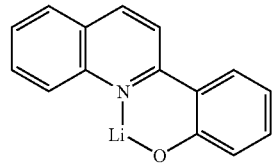

(T-2)

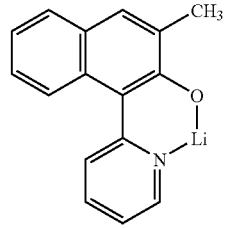

(T-3)

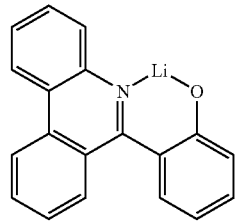

(T-4)

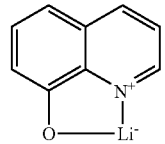

(T-5)

The thickness of EIL 180 including the alkaline metal complexes or alkaline earth metal complexes is typically less than 20 nm, and preferably in the range of less than 5 nm.

When light emission is viewed solely through the anode 110, the cathode 190 includes nearly any conductive material. Desirable materials have effective film-forming properties to ensure effective contact with the underlying organic layer, promote electron injection at low voltage, and have effective stability. Useful cathode materials often contain a low work function metal (−4.0 eV) or metal alloy. One preferred cathode material includes a Mg:Ag alloy as described in U.S. Pat. No. 4,885,221. Another suitable class of cathode materials includes bilayers including a thin inorganic EIL in contact with an organic layer (e.g., organic EIL or ETL), which is capped with a thicker layer of a conductive metal. Here, the inorganic EIL preferably includes a low work function metal or metal salt and, if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. No. 5,059,861, U.S. Pat. No. 5,059,862, and U.S. Pat. No. 6,140,763.

When light emission is viewed through the cathode, cathode 190 should be transparent or nearly transparent. For such applications, metals should be thin or one should use transparent conductive oxides, or include these materials. Optically transparent cathodes have been described in more detail in U.S. Pat. No. 4,885,211, U.S. Pat. No. 5,247,190, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, U.S. Pat. No. 6,278,236, U.S. Pat. No. 6,284,393, and EP 1 076 368. Cathode materials are typically deposited by thermal evaporation, electron beam evaporation, ion sputtering, or chemical vapor deposition. When needed, patterning is achieved through many well known methods including, but not limited to, through-mask deposition, integral shadow masking, for example as described in U.S. Pat. No. 5,276,380 and EP 0 732 868, laser ablation, and selective chemical vapor deposition.

In the prior art OLED 400, the exciton-blocking layer 440 is similar to one of the exciton-blocking layers used in OLED 100 and OLED 200 of the present invention. More detailed discussion can be found in US 2006/0,134,460 A1.

In some instances, a hole-blocking layer (HBL) may be disposed between LEL 150 and ETL 170. The hole-blocking layer includes an electron-transporting material having a HOMO level at least 0.2 eV lower than that of the host in the LEL 150. In other words, applying a HBL adjacent to the LEL can create a hole escape barrier at the interface between the LEL and the HBL. In some instances, layers 150 or 170 can optionally be collapsed with an adjacent layer into a single layer that serves the function of supporting both light emission and electron transportation. It also known in the art multiple materials may be added to one or more layers in order to create a white emitting OLED, for example, by combining blue- and yellow emitting materials, cyan- and red emitting materials, or red-, green-, and blue emitting materials. White emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182 and can be equipped with a suitable filter arrangement to produce a color emission.

The phosphorescent OLED is typically provided over a supporting substrate where either the anode 110 or cathode 190 can be in contact with the substrate. The electrode in contact with the substrate is conveniently referred to as the bottom electrode. Conventionally, the bottom electrode is the anode 110, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure comprising multiple layers of materials. This is typically the case for active matrix substrates wherein TFTs are provided below the OLED layers. It is still necessary that the substrate, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate can be a complex structure comprising multiple layers of materials such as found in active matrix TFT designs. It is necessary to provide in these device configurations a light-transparent top electrode.

The organic materials mentioned above are suitably deposited by any means suitable for the form of the organic materials. In the case of small molecules, they are conveniently deposited through sublimation or evaporation, but can be deposited by other means such as coating from a solvent together with an optional binder to improve film formation. If the material is a polymer, solvent deposition is usually preferred. The material to be deposited by sublimation or evaporation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,688,551, U.S. Pat. No. 5,851,709 and U.S. Pat. No. 6,066,357) or an inkjet method (U.S. Pat. No. 6,066,357).

OLED devices of this invention can employ various well-known optical effects in order to enhance their emissive properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the EL devices constructed according to the present invention.

One advantageous use of this invention is part of a tandem OLED which generally has at least two light-emitting units joined together by a non-emitting intermediate connector. These individual light-emitting units each are composed of one or more separate light-emitting layers and each unit may emit substantially the same or different colors of light. Preferably, they emit different colors of light. By substantially, it is meant that one color of light predominates (more than 50% of the emission). Other smaller amounts of light of different color may be present in addition to the predominate color emission. The invention may be used in more than one of the light-emitting units of a tandem OLED device.

Embodiments of the invention (OLED 100 and OLED 200) can provide advantageous features such as higher luminous yield, low drive voltage, and higher power efficiency. In one desirable embodiment the OLED is part of a display device. Embodiments of the invention can also provide an area lighting device or other electronic device.

EXAMPLES

The following examples are presented for a further understanding of the present invention. The reduction potential and the oxidation potential of the materials were measured using a Model CHI660 electrochemical analyzer (CH Instruments, Inc., Austin, Tex.) with the method as discussed before. During the fabrication of OLEDs, the thickness of the organic layers and the doping concentrations were controlled and measured in situ using calibrated thickness monitors built in an evaporation system (Made by Trovato Mfg., Inc., Fairport, N.Y.). The EL characteristics of all the fabricated devices were evaluated using a constant current source (KEITHLEY 2400 SourceMeter, made by Keithley Instruments, Inc., Cleveland, Ohio) and a photometer (PHOTO RESEARCH SpectraScan PR 650, made by Photo Research, Inc., Chatsworth, Calif.) at room temperature. Operational lifetime (or stability) of the devices was tested at the loom temperature and at an initial luminance of 1,000 cd/m$^2$ by driving a constant current through the devices. The color was reported using Commission Internationale de l'Eclairage (CIE) coordinates.

Comparative Examples 1-3

The preparation of a conventional OLED (Device 1) is as follows: A~1.1 mm thick glass substrate coated with a transparent ITO conductive layer was cleaned and dried using a commercial glass scrubber tool. The thickness of ITO is about 22 nm and the sheet resistance of the ITO is about 68Ω/square. The ITO surface was subsequently treated with oxidative plasma to condition the surface as an anode. A layer of $CF_x$, 1 nm thick, was deposited on the clean ITO surface as the anode buffer layer by decomposing $CHF_3$ gas in an RF plasma treatment chamber. The substrate was then transferred into a vacuum deposition chamber for deposition of all other layers on top of the substrate. The following layers were deposited in the following sequence by evaporation from a heated boat under a vacuum of approximately 10$^{-6}$ Torr:

a) a HTL, 95 nm thick, including N,N'-di-1-naphthyl-N,N'-diphenyl-4,4'-diaminobiphenyl (NPB);

(d) a LEL, 20 nm thick, including 2,2',2"-(1,3,5-phenylene)tris[1-phenyl-1H-benzimidazole] (TPBI);

e) an ETL, 40 nm thick, including 4,7-diphenyl-1,10-phenanthroline (Bphen);

f) an EIL, 1 nm thick, LiF; and g) a cathode: approximately 100 nm thick, including Al.

After the deposition of these layers, the device was transferred from the deposition chamber into a dry box (made by VAC Vacuum Atmosphere Company, Hawthorne, Calif.) for encapsulation. The OLED has an emission area of 10 nm$^2$.

Figure 5:
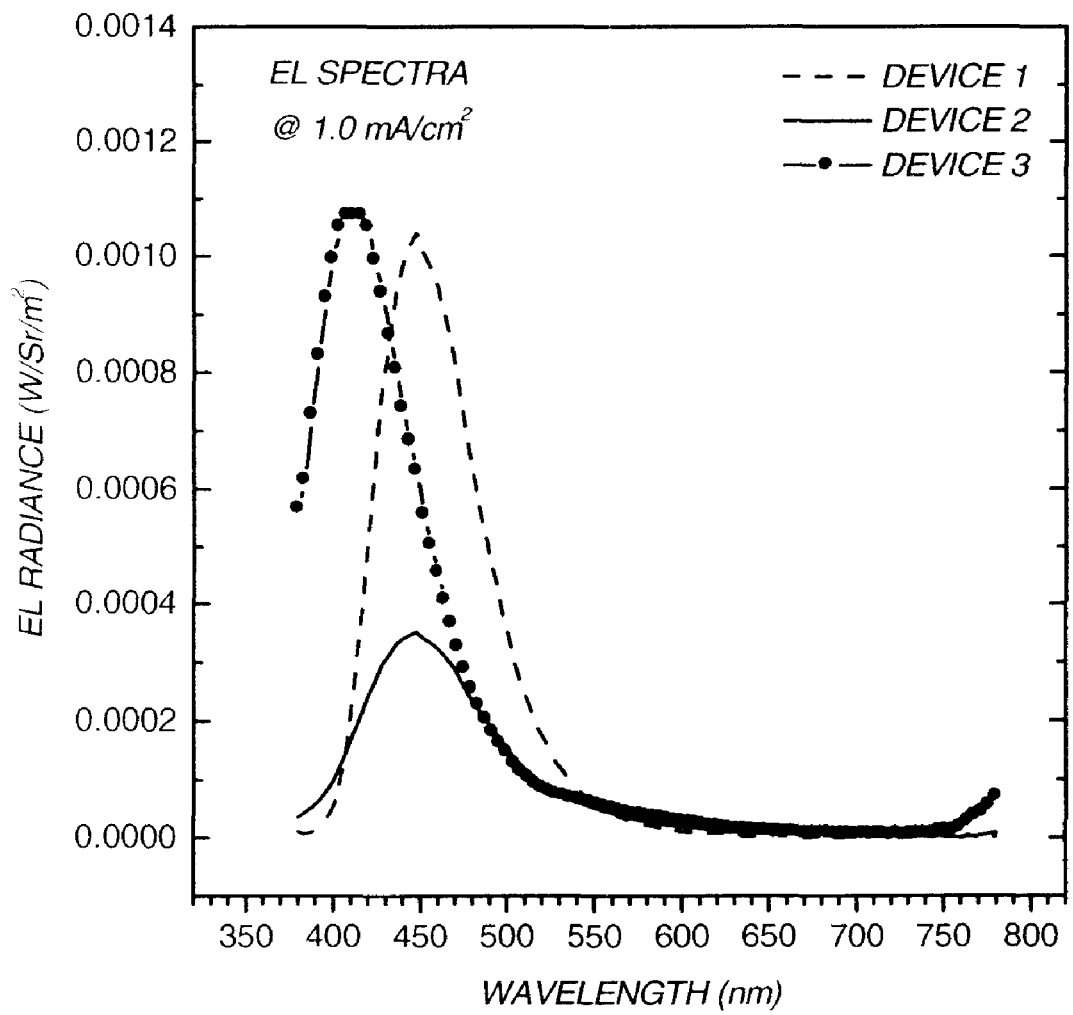
FIG. 5 shows the EL spectra of Devices 1, 2, and 3 tested at 1.0 mA/cm$^2$.

Device 1 is denoted as: ITO/95 nm NPB/20 nm TPBI/40 nm Bphen/1 nm LiF/100 nm Al. The exciton formation zone of the device is at and near the interface of NPB/TPBI (or of HTL/LEL). The EL spectrum of Device 1 is shown in FIG. 5. This device has an EL peak wavelength of about 447 nm. The EL emission of the device having the peak wavelength of 447 nm is believed to be from the NPB layer. Since both the singlet energy and the triplet energy of TPBI are higher than those of NPB, it is understandable that excitions can easily diffuse into NPB layer to cause light emission from the NPB layer. Since there is no exciton-blocking layer between NPB and TPBI (or between the HTL/LEL), excitons cannot be confined in the LEL to cause light emission from the TPB layer. Therefore, it can be anticipated that high quantum efficiency could not be achieved if a phosphorescent dopant is doped into the TPBI layer to form a phosphorescent OLEDs.

Another OLED (Device 2) is fabricated with the same method and the same layer structure as Example 1, except that a first exciton-blocking layer is inserted between the HTL and the LEL layer. The layer structure is:

a) a HTL, 85 nm thick, including NPB;

b) a first exciton-blocking layer (1$^{st}$ EBL), 10 nm thick, including 4-(9H-carbazol-9-yl)-N,N-bis[4-(9H-carbazol-9-yl)phenyl]-benzenamine (TCTA);

d) a LEL, 20 nm thick, including TPBI;

e) an ETL, 40 nm thick, including Bphen;

f) an EIL, 1 nm thick, LiF; and g) a cathode: approximately 100 nm thick, including Al.

Device 2 is denoted as: ITO/85 nm NPB/10 nm TCTA/20 nm TPBI/40 nm Bphen/1 nm LiF/100 nm Al. The exciton formation zone of the device is at and near the interface of TCTA/TPBI (or of the 1$^{st}$ EXBL/LEL). The EL spectrum of Device 1 is shown in FIG. 5. In comparison with Device 1, Device 2 also has an EL peak wavelength of about 447 nm with broader spectral width. However, the EL peak intensity of Device 2 is lower. The peak intensity ratio between Device 1 and Device 2 is about 2.5. It indicates that TCTA is an effective exciton-blocking layer which can reduce the exciton diffusion from the LEL into the HTL. However it also indicates that this EXBL cannot fully block the exciton diffusion. The spectral broadening is believed to be caused by weak exciplex emission at about 470 nm and by weak TPBI emission at about 415 nm. Therefore, it can be anticipated that improved quantum efficiency could be achieved due to the exciton-blocking effect if a phosphorescent dopant is doped into the TPBI layer to form a phosphorescent OLEDs.

Another OLED (Device 3) is fabricated with the same method and the same layer structure as Example 1, except that two exciton-blocking layers are inserted between the HTL and the LEL layer. The layer structure is:

a) a HTL, 75 nm thick, including NPB;

b) a 1$^{st}$ EBL, 10 nm thick, including TCTA;

c) a 2$^{nd}$ EBL, 10 nm thick, including 9,9'-[1,1'-biphenyl]-4,4'-diylbis-9H-carbazole (CBP);

d) a LEL, 20 nm thick, including TPBI;

e) an ETL, 40 nm thick, including Bphen;

f) an EIL, 1 nm thick, LiF; and g) a cathode: approximately 100 nm thick, including Al.

Device 3 is denoted as: ITO/75 nm NPB/10 nm TCTA/10 CBP/20 nm TPBI/40 nm Bphen/1 nm LiF/100 nm Al. The exciton formation zone of the device is at and near the interface of CBP/TPBI (or of the 2$^{nd}$ EXBL/LEL). The EL spectrum of Device 1 is shown in FIG. 5. In comparison with Device 1 and Device 2. Device 3 shows an EL peak wavelength of about 415 nm. The EL emission of the device having the peak wavelength of 415 nm is believed to be from the TPBI layer. It indicates that with two exciton-blocking layers, excitons can be fully confined without diffusing into the HTL. Therefore, it can be anticipated that high quantum efficiency could be achieved due to the full exciton-blocking effect if a phosphorescent dopant is doped into the TPBI layer to form a phosphorescent OLED.

Examples 4-6

A comparative phosphorescent OLED (Device 4) is fabricated with the same method and the same layer structure as Example 1, except that the LEL is a TPBI layer doped with 7% of Ir(ppy)$_3$ by volume.

Figure 6:
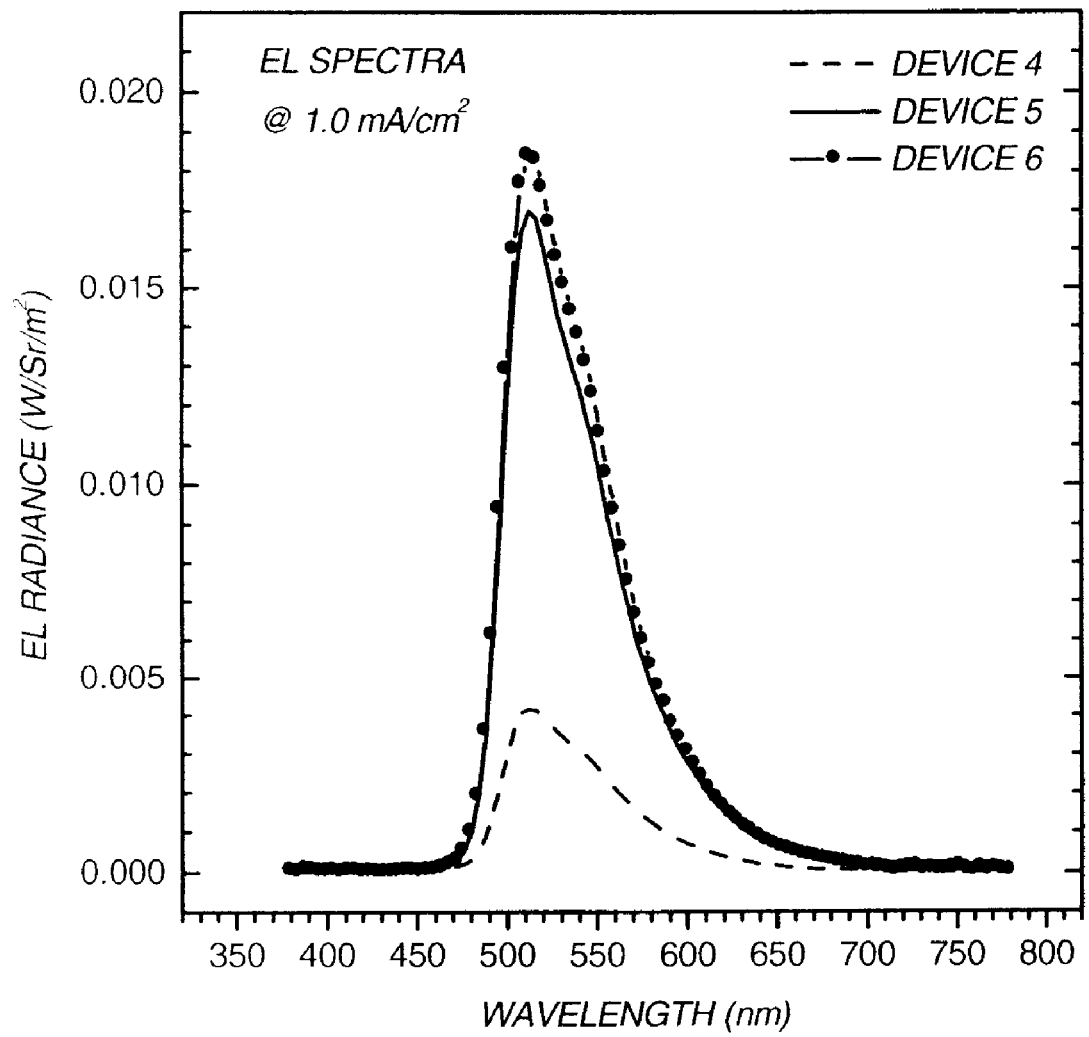
FIG. 6 shows the EL spectra of Devices 4, 5, and 6 tested at 1.0 mA/cm$^2$.

Device 4 is denoted as: ITO/95 nm NPB/20 nm TPBI:7 vol. % Ir(ppy)$_3$/40 nm Bphen/1 nm LiF/100 nm Al. The EL performance of the device is summarized in Table 1, and its EL spectrum is shown in FIG. 6.

Another comparative phosphorescent OLED (Device 5) is fabricated with the same method and the same layer structure as Example 2, except that the LEL is a TPBI layer doped with 7% of Ir(ppy)$_3$ by volume.

Device 5 is denoted as: ITO/85 nm NPB/10 nm TCTA/20 nm TPBI:7 vol. % Ir(ppy)$_3$/40 nm Bphen/1 nm LiF/100 nm Al. The EL performance of the device is summarized in Table 1, and its EL spectrum is shown in FIG. 6.

An inventive phosphorescent OLED (Device 6) is fabricated with the same method and the same layer structure as Example 3, except that the LEL is a TPBI layer doped with 7% of Ir(ppy)$_3$ by volume.

Device 6 is denoted as: ITO/75 nm NPB/10 nm TCTA/10 nm CBP/20 nm TPBI:7 vol. % Ir(ppy)$_3$/40 nm Bphen/1 nm LiF/100 nm Al. The EL performance of the device is summarized in Table 1, and its EL spectrum is shown in FIG. 6.

TABLE 1

| Example (EL measured @ RT and 1.0 mA/cm$^2$) | Voltage (V) | Luminance (cd/m$^2$) | Luminous Efficiency (cd/A) | CIE x (1931) | CIE y (1931) | External Quantum Efficiency (%) |
|---|---|---|---|---|---|---|
| 4 (Comp) | 3.4 | 145 | 14.5 | 0.281 | 0.613 | 5.26 |
| 5 (Comp) | 3.7 | 576 | 57.6 | 0.281 | 0.631 | 16.7 |
| 6 (Inv)  | 4.1 | 637 | 63.7 | 0.283 | 0.632 | 18.3 |

As can be seen from Table 1, by inserting a 1$^{st}$ EXBL between the HTL and the LEL, the external quantum efficiency of Device 5 increases substantially. The external quantum efficiency has another 10% increase by inserting a 2$^{nd}$ EXBL between the 1$^{st}$ EXBL and the LEL (Device 6). It confirms that effectively blocking excitons from diffusing into the HTL can improve the quantum efficiency of the phosphorescent OLEDs. In this example, the material of the 1$^{st}$ XBL (TCTA) has a triplet energy (2.85) that is greater than that of the phosphorescent host (TPBI) with a triplet energy of 2.69. The triplet energy of the 2$^{nd}$ XBL layer (CBP=2.67) is less than that of the 1$^{st}$ XBL (TCTA=2.85). In addition the triplet energy of the 2$^{nd}$ XBL layer (CBP=2.67) is also greater than of the phosphorescent dopant (Ir(ppy)3=2.54). Moreover, the E$^{ox}$ of both the 1$^{st}$ and 2$^{nd}$ XBL are the same (−1.3 V) and the E$^{red}$ of the 2$^{nd}$ XBL (CBP=−2.34 V) is less (more negative) than that of the phosphorescent host (TPBI=−2.02 V).

Examples 7-8

A comparative phosphorescent OLED (Device 7) is constructed in the same manner as that of Example 1. The layer structure is:
  a) an HTL, 10 nm thick, including hexaazatriphenylene hexacarbonitrile (HAT-CN);
  b) a HTL, 75 nm thick, including NPB;
  c) a 1$^{st}$ EBL, 10 nm thick, including TCTA;
  e) a LEL, 20 nm thick, including Bphen doped with 7% of Ir(ppy)$_2$(cou1) by volume;
  f) an ETL, 50 nm thick, including Bphen;
  g) an EIL, 2 nm thick, including Formula (T-1); and
  h) a cathode: approximately 100 nm thick, including Al.

Figure 7:
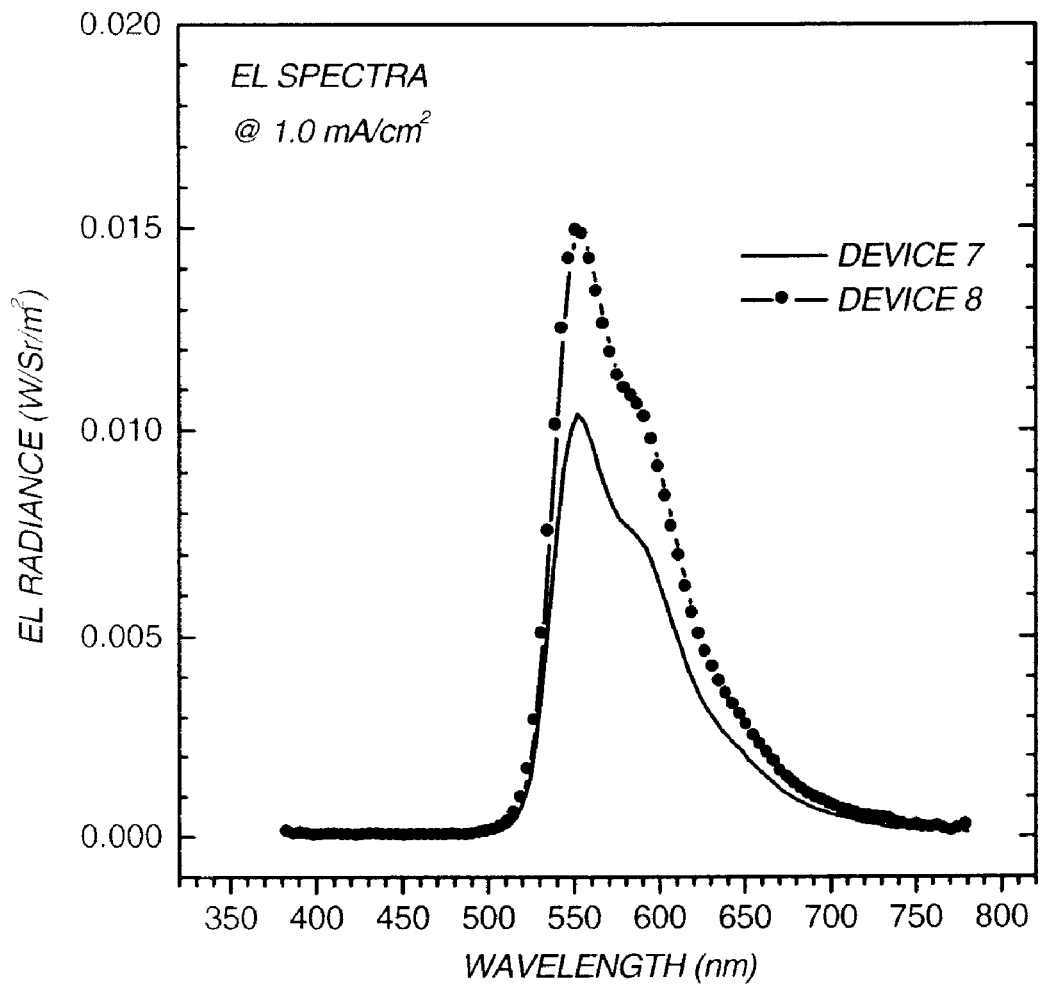
FIG. 7 shows the EL spectra of Devices 7 and 8 tested at 1.0 mA/cm$^2$.

Device 7 is denoted as: ITO/10 nm HAT-CN/75 nm NPB/10 nm TCTA/20 nm Bphen:7% Ir(ppy)$_2$(cou1)/50 nm Bphen/2 nm (T-1)/100 nm Al. The EL performance of the device is summarized in Table 2, and its EL spectrum is shown in FIG. 7.

An inventive phosphorescent OLED (Device 8) is constructed in the same manner and the same layer structure as that of Example 7, except that a 2$^{nd}$ EXBL is inserted between the 1$^{st}$ EXBL and the LEL layer. The layer structure is:
  a) an HIL, 10 nm thick, including HAT-CN;
  b) a HTL, 75 nm thick, including NPB;
  c) a 1$^{st}$ EBL, 10 nm thick, including TCTA;
  d) a 2$^{nd}$ EBL, 8 nm thick, including CBP;
  e) a LEL, 20 nm thick, including Bphen doped with 7% of Ir(ppy)$_2$(cou1) by volume:
  f) an ETL, 50 nm thick, including Bphen;
  g) an EIL, 2 nm thick, including Formula (T-1); and
  h) a cathode: approximately 100 nm thick, including Al.

Device 8 is denoted as: ITO/10 nm HAT-CN/75 nm NPB/10 nm TCTA/8 nm CBP/20 nm Bphen:7% Ir(ppy)$_2$(cou1)/50 nm Bphen/2 nm (T-1)/100 nm Al. The EL performance of the device is summarized in Table 2, and its EL spectrum is shown in FIG. 7.

TABLE 2

| Example (EL measured @ RT and 1.0 mA/cm$^2$) | Voltage (V) | Luminance (cd/m$^2$) | Luminous Efficiency (cd/A) | CIE x (1931) | CIE y (1931) | External Quantum Efficiency (%) |
|---|---|---|---|---|---|---|
| 7 (Comp) | 3.6 | 421 | 42.1 | 0.449 | 0.542 | 12.6 |
| 8 (Inv)  | 3.6 | 598 | 59.8 | 0.453 | 0.540 | 17.8 |

In Examples 7 and 8, a triplet yellow dopant, instead of a triplet green dopant, is doped into the Bphen layer to form the LEL. Although the dopant and the host are different from those in Examples 4-6, by inserting a 2$^{nd}$ EXBL between the 1$^{st}$ EXBL and the LEL, the external quantum efficiency of Device 8 is increased by more than 40% than that of Example 7. It confirms again that inserting a 2$^{nd}$ EXBL between the 1$^{st}$ EXBL and the LEL effectively can further block excitons from diffusing into the HTL, which results in the improvement of the quantum efficiency of the phosphorescent OLEDs. In example 8, the triplet energy of the 1$^{st}$ XBL (TCTA=2.85) is greater than that of the phosphorescent host (Bphen-2.64).

Examples 9-14

A comparative phosphorescent OLED (Device 9) is constructed in the same manner as that of Example 7. The layer structure is:
  a) an HIL, 10 nm thick, including HAT-CN;
  b) a HTL, 75 nm thick, including NPB;
  c) a 1$^{st}$ EBL, 10 nm thick, including TCTA;
  e) a LEL, 20 nm thick, including TPBI doped with 7% of Ir(ppy)$_2$(cou1) by volume;
  f) an ETL, 50 nm thick, including Bphen;
  g) an EIL, 2 nm thick, including Formula (T-1); and
  h) a cathode: approximately 100 nm thick, including Al.

Figure 8:
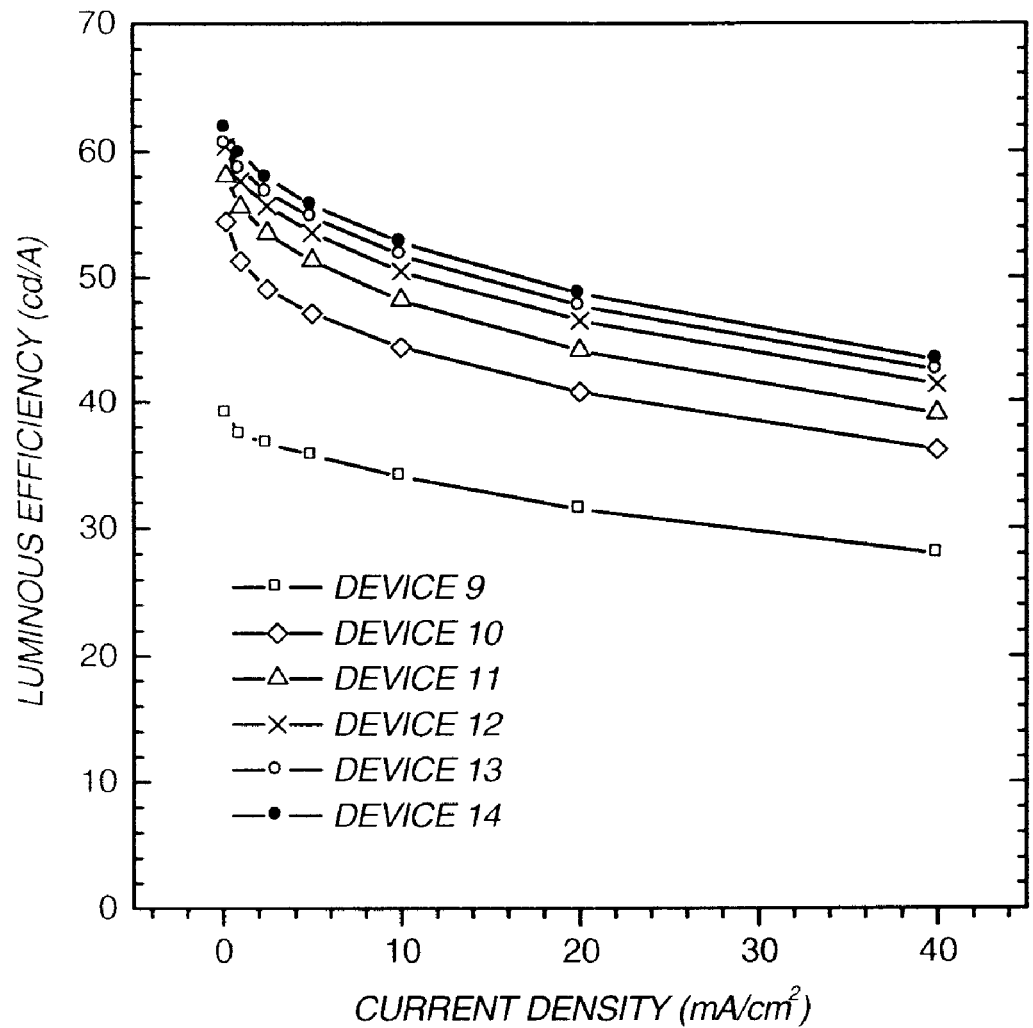
FIG. 8 shows the plots of the luminous efficiency versus current density of Devices 9-14.
Figure 9:
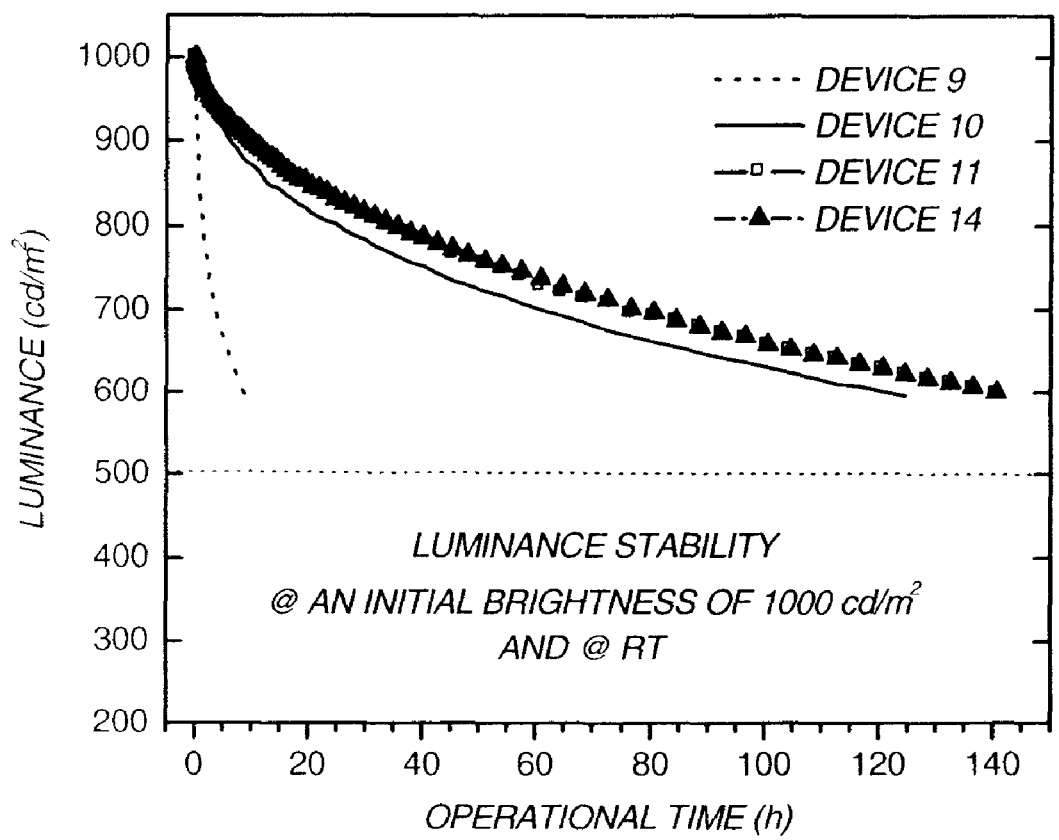
FIG. 9 shows the operational stability of Devices 9, 10, 11, and 14 tested at an initial luminance of 1000 nits and at the room temperature.

Device 9 is denoted as: ITO/10 nm HAT-CN/75 nm NPB/10 nm TCTA/20 nm TPBI:7% Ir(ppy)$_2$(cou1)/50 nm Bphen/2 nm (T-1)/100 nm Al. The EL performance of Device 9 is summarized in Table 3, and the change of luminous efficiency vs. current density is shown in FIG. 8. Moreover, the operational stability vs. operational time of this device is shown in FIG. 9.

An inventive phosphorescent OLED (Device 10) is constructed in the same manner and the same layer structure as that of Example 9, except that a $2^{nd}$ EXBL is inserted between the $1^{st}$ EXBL and the LEL. The layer structure is:

a) an HIL, 10 nm thick, including HAT-CN;
b) a HTL, 75 nm thick, including NPB;
c) a $1^{st}$ EBL, 10 nm thick, including TCTA;
d) a $2^{nd}$ EBL, 2 nm thick, including CBP;
e) a LEL, 20 nm thick, including TPBI doped with 7% of Ir(ppy)$_2$(cou1) by volume;
f) an ETL, 50 nm thick, including Bphen;
g) an EIL, 2 nm thick, including Formula (T-1); and
h) a cathode: approximately 100 nm thick, including Al.

Device 10 is denoted as: ITO/10 nm HAT-CN/75 nm NPB/10 nm TCTA/2 nm CBP/20 nm TPBI:7% Ir(ppy)$_2$(cou1)/50 nm Bphen/2 nm (T-1)/100 nm Al. The EL performance of Device 10 is summarized in Table 3, and the change of luminous efficiency vs. current density is shown in FIG. 8. Moreover, the operational stability vs. operational time of this device is shown in FIG. 9.

Another inventive phosphorescent OLED (Device 11) is constructed in the same manner and the same layer structure as that of Example 10, except that the thickness of the $2^{nd}$ EXBL in layer (d) is increased from 2 nm to 4 nm. The EL performance of Device 11 is summarized in Table 3, and the change of luminous efficiency vs. current density is shown in FIG. 8. Moreover, the operational stability vs. operational time of this device is shown in FIG. 9.

Another inventive phosphorescent OLED (Device 12) is constructed in the same manner and the same layer structure as that of Example 10, except that the thickness of the $2^{nd}$ EXBL in layer (d) is increased from 2 nm to 8 nm. The EL performance of Device 12 is summarized in Table 3, and the change of luminous efficiency vs. current density is shown in FIG. 8.

Another inventive phosphorescent OLED (Device 13) is constructed in the same manner and the same layer structure as that of Example 10, except that the thickness of the $2^{nd}$ EXBL in layer (d) is increased from 2 nm to 10 nm. The FL performance of Device 13 is summarized in Table 3, and the change of luminous efficiency vs. current density is shown in FIG. 8.

Another inventive phosphorescent OLED (Device 14) is constructed in the same manner and the same layer structure as that of Example 10, except that the thickness of the $2^{nd}$ EXBL in layer (d) is increased from 2 nm to 12 nm. The EL performance of Device 14 is summarized in Table 3, and the change of luminous efficiency vs. current density is shown in FIG. 8. Moreover, the operational stability vs. operational time of this device is shown in FIG. 9.

As can be seen from Table 3, by inserting the $2^{nd}$ EXBL between the $1^{st}$ EXBL and the LEL, the external quantum efficiency is increased by up to 60% (Device 14 vs. Device 9) in this set of devices. More importantly, the lifetime of the devices having the $2^{nd}$ EXBL is substantially increased.

The invention has been described in detail with particular reference to certain preferred OLED embodiments thereof, but it will be understood that variations and modifications can be effected within the spirit and scope of the invention.

PARTS LIST

100 Organic light emitting device (OLED)
110 Anode
120 Hole-injecting layer (HIL)
130 Hole-transporting layer (HTL)
141 First exciton-blocking layer ($1^{st}$ EXBL)
142 Second exciton-blocking layer ($2^{nd}$ EXBL)
150 Phosphorescent light-emitting layer (LEL)
170 Electron-transporting layer (ETL)
180 Electron-injecting layer (EIL)
190 Cathode
200 Organic light emitting device (OLED)
300 Organic light emitting device (OLED)
400 Organic light emitting device (OLED)
440 Exciton-blocking layer in a prior art OLED

The invention claimed is:
1. An organic light-emitting device comprising:
a. an anode;
b. a cathode;
c. a hole-transporting layer disposed between the anode and the cathode;
d. a phosphorescent light-emitting layer disposed between the hole-transporting layer and the cathode, wherein the phosphorescent light-emitting layer includes at least one host and at least one phosphorescent dopant;
e. a first exciton-blocking layer disposed between the hole-transporting layer and the phosphorescent light-emitting layer; wherein the first exciton-blocking layer includes a first exciton-blocking material that has a triplet energy greater than the triplet energy of the host in the phosphorescent light-emitting layer; and
f. a second exciton-blocking layer disposed between the first exciton-blocking layer and the phosphorescent light-emitting layer, wherein the second exciton-blocking layer is in contact with the phosphorescent light-emitting layer, and wherein the second exciton-blocking

TABLE 3

| Example (EL measured @ RT and 1.0 mA/cm$^2$) | Voltage (V) | Luminance (cd/m$^2$) | Luminous Efficiency (cd/A) | CIE x (1931) | CIE y (1931) | External Quantum Efficiency (%) | Lifetime (T$_{50}$ @ 1000 nits) (h) |
|---|---|---|---|---|---|---|---|
| 9 (Comp) | 3.4 | 374 | 37.4 | 0.445 | 0.546 | 11.0 | ~20 |
| 10 (Inv) | 3.4 | 513 | 51.3 | 0.446 | 0.546 | 15.2 | ~250 |
| 11 (Inv) | 3.5 | 556 | 55.6 | 0.446 | 0.546 | 16.4 | ~290 |
| 12 (Inv) | 3.6 | 577 | 57.7 | 0.446 | 0.546 | 17.0 | |
| 13 (Inv) | 3.6 | 586 | 58.6 | 0.446 | 0.546 | 17.3 | |
| 14 (Inv) | 3.7 | 598 | 59.8 | 0.447 | 0.546 | 17.6 | ~290 | layer includes a second exciton-blocking material that has a triplet energy less than the triplet energy of the first exciton-blocking material, wherein the first exciton-blocking material and the second exciton-blocking material are different carbazole derivatives represented by formula (J):

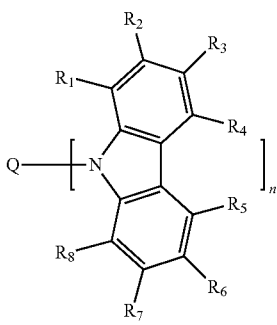

wherein:
n is an integer from 1 to 4;
Q is phenyl, substituted phenyl, biphenyl, substituted biphenyl, aryl, or substituted aryl group;
$R_1$ through $R_8$ are independently hydrogen, alkyl, phenyl or substituted phenyl, aryl amine, carbazole, or substituted carbazole and provided that $R_1$-$R_8$ do not contain aromatic hydrocarbon fused rings.

2. The organic light-emitting device of claim 1, wherein the second exciton-blocking layer enhances the exciton-blocking effect and eliminates light emission from the hole-transporting layer.

3. The organic light-emitting device of claim 1 wherein the second exciton-blocking layer has a triplet energy greater than the triplet energy of the dopant in the phosphorescent light-emitting layer.

4. The organic light-emitting device of claim 1 wherein the second exciton-blocking layer has an oxidation potential not less than the oxidation potential of the first exciton-blocking layer.

5. The organic light-emitting device of claim 1 wherein the second exciton-blocking layer has an oxidation potential less than the oxidation potential of the host in the phosphorescent light-emitting layer.

6. The organic light-emitting device of claim 1 wherein the second exciton-blocking layer has a reduction potential less than the reduction potential of the host in the phosphorescent light-emitting layer.

7. The organic light-emitting device of claim 1 wherein the first exciton-blocking layer and the second exciton-blocking layer each has a thickness in the range of from 1 nm to 50 nm.

8. The organic light-emitting device of claim 1 wherein the first exciton-blocking layer and the second exciton-blocking layer each has a thickness in the range of from 2 nm to 20 nm.

9. The organic light-emitting device of claim 1 wherein the carbazole derivative in the first exciton-blocking layer is selected from:

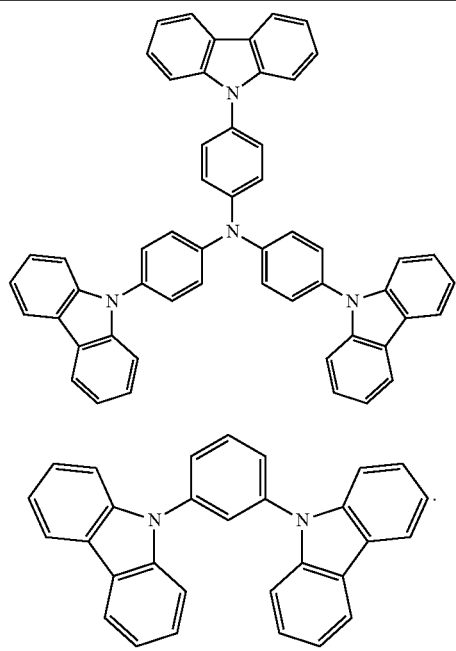

10. The organic light-emitting device of claim 1 wherein the carbazole derivative in the second exciton-blocking layer is selected from 9,9'41,'-biphenyl]-4,4'-diylbis-9H-carbazole (CBP), 9,9'-(2,2'-dimethyl[1,1'-biphenyl]-4,4'-diyl)bis-9H-carbazole (CDBP) and 9,9'-(1,4-phenylene)bis-9H-carbazole.

11. The organic light-emitting device of claim 1 wherein the host in the phosphorescent light-emitting layer includes an electron-transporting material.

12. The organic light-emitting device of claim 11 wherein the electron-transporting materials is a benzazole derivative represented by structural formula (K):

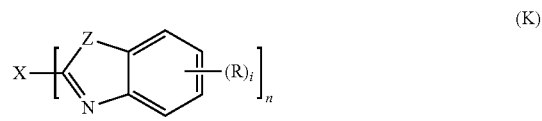

wherein:
n is selected from 2 to 8 and i is selected from 1-5;
Z is independently O, NR or S;
R is individually hydrogen; alkyl of from 1 to 24 carbon atoms aryl or hetero-atom substituted aryl of from 5 to 20 carbon atoms, halo, or atoms necessary to complete a fused aromatic ring; and
X is a linkage unit including carbon, alkyl, aryl, substituted alkyl, or substituted aryl, which conjugately or unconjugately connects the multiple benzazoles together.

13. The organic light-emitting device of claim 12 wherein the benzazole derivative includes 2,2',2"-(1,3,5-phenylene)tris[1-phenyl-1H-benzimidazole] (TPBI).

14. The organic light-emitting device of claim 11 wherein the electron-transporting material is an aluminum or gallium complex represented by Formula (R-a):

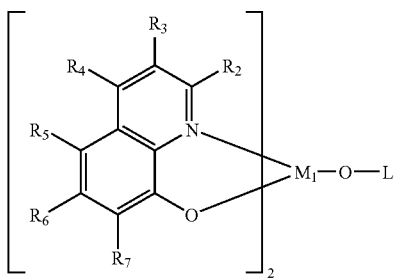

(R-a)

wherein:

M₁ is Al or Ga; and

R₂-R₇ independently represent hydrogen or an alkyl group; and

L is an aromatic moiety with 6 to 30 carbon atoms.

15. The organic light-emitting device of claim 14 wherein the aluminum or gallium complex includes aluminum(III) bis(2-methyl-8-hydroxyquinoline)-4-phenylphenolate [alias, Balq] and gallium oxine [alias, tris(8-quinolinolato) gallium(III).

16. The organic light-emitting device of claim 1 wherein the device includes two light-emitting layers.

17. The organic light-emitting device of claim 16 wherein the two light-emitting layers emit light of substantially different colors.

18. The OLED of claim 1 wherein the phosphorescent dopant in the phosphorescent light-emitting layer is selected from tris(1-phenylisoquinoline) iridium (III) (Ir(piq)₃), Ir(ppy)₂(cou1), Ir(cou2)₂ppy, or tris(2-phenylpyridine) iridium (III) (Ir(ppy)₃).

19. The organic light-emitting device of claim 1 that produces white light.

* * * * *